United States Patent
Kim et al.

(10) Patent No.: US 11,469,132 B2
(45) Date of Patent: Oct. 11, 2022

(54) METHOD OF ALIGNING MICRO LIGHT EMITTING ELEMENT AND DISPLAY TRANSFERRING STRUCTURE

(71) Applicant: SAMSUNG ELECTRONICS CO., LTD., Suwon-si (KR)

(72) Inventors: Hyunjoon Kim, Seoul (KR); Kyungwook Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/154,773

(22) Filed: Jan. 21, 2021

(65) Prior Publication Data
US 2022/0051924 A1 Feb. 17, 2022

(30) Foreign Application Priority Data
Aug. 13, 2020 (KR) ........................ 10-2020-0102055

(51) Int. Cl.
| | |
|---|---|
| H01L 21/683 | (2006.01) |
| H01L 25/075 | (2006.01) |
| H01L 33/20 | (2010.01) |
| H01L 33/62 | (2010.01) |

(52) U.S. Cl.
CPC ...... *H01L 21/6835* (2013.01); *H01L 25/0753* (2013.01); *H01L 33/20* (2013.01); *H01L 33/62* (2013.01); *H01L 2221/68309* (2013.01); *H01L 2221/68354* (2013.01); *H01L 2221/68368* (2013.01); *H01L 2933/0066* (2013.01)

(58) Field of Classification Search
CPC . H01L 21/6835; H01L 25/0753; H01L 33/20; H01L 33/62; H01L 2221/68309; H01L 2221/68354; H01L 2221/68368; H01L 2933/0066

USPC ........................................................ 438/28
See application file for complete search history.

(56) References Cited

U.S. PATENT DOCUMENTS

| | | | |
|---|---|---|---|
| 6,599,769 B2 | 7/2003 | Kondo et al. | |
| 6,864,570 B2 | 3/2005 | Smith | |
| 7,033,854 B2 | 4/2006 | Morita | |
| (Continued) | | | |

FOREIGN PATENT DOCUMENTS

| | | |
|---|---|---|
| JP | 3829594 B2 | 10/2006 |
| JP | 4082031 B2 | 4/2008 |
| (Continued) | | |

OTHER PUBLICATIONS

Tingzhu Wu et al., "Mini-LED and Micro-LED: Promising Candidates for the Next Generation Display Technology", applied sciences, vol. 8, 1557; doi:10.3390, Sep. 5, 2018, 17 pages total.

*Primary Examiner* — Vu A Vu
(74) *Attorney, Agent, or Firm* — Sughrue Mion, PLLC

(57) ABSTRACT

A method of aligning micro light emitting elements includes supplying the plurality of micro light emitting elements on a substrate including a plurality of grooves having different shapes, the plurality of micro light emitting elements being configured to be inserted exclusively and respectively into the plurality of grooves; respectively inserting the plurality of micro light emitting elements into the plurality of grooves; and aligning the plurality of micro light emitting elements, wherein at least one groove of the plurality of grooves has a shape that is different from a shape of a respective micro light emitting element inserted into the at least one groove.

20 Claims, 29 Drawing Sheets

(56) References Cited

U.S. PATENT DOCUMENTS

| 9,825,202 | B2 | 11/2017 | Schuele et al. |
| 10,516,084 | B2 | 12/2019 | Sasaki et al. |
| 2001/0031514 | A1 | 10/2001 | Smith |
| 2019/0006564 | A1 | 1/2019 | Sasaki et al. |
| 2021/0151633 | A1 | 5/2021 | Sasaki et al. |
| 2021/0233795 | A1* | 7/2021 | Wang .................. H01L 21/67 |

FOREIGN PATENT DOCUMENTS

| JP | 4352473 B2 | 10/2009 |
| KR | 10-2019-0111151 A | 10/2019 |
| KR | 10-2042178 B1 | 11/2019 |

* cited by examiner

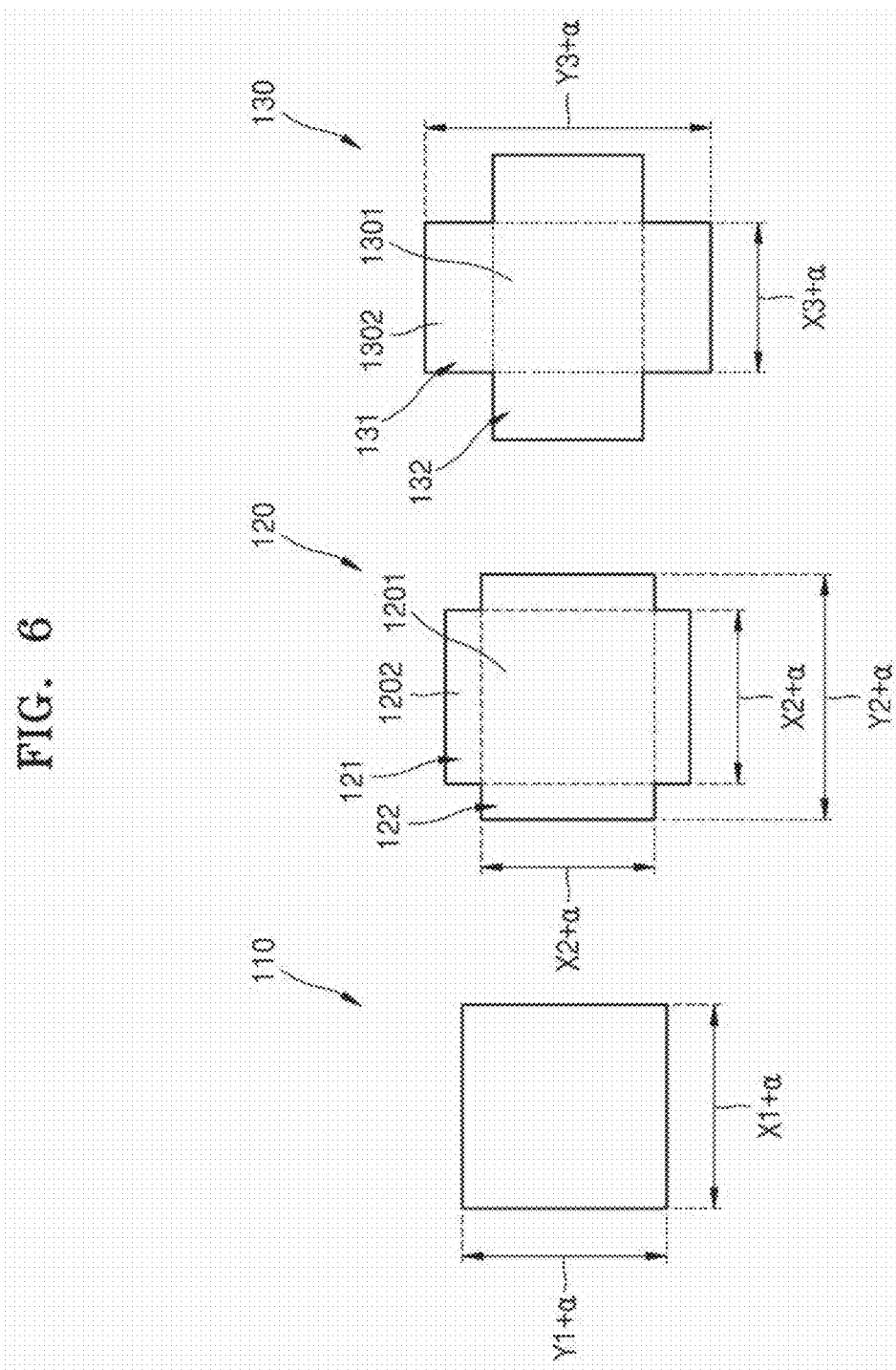

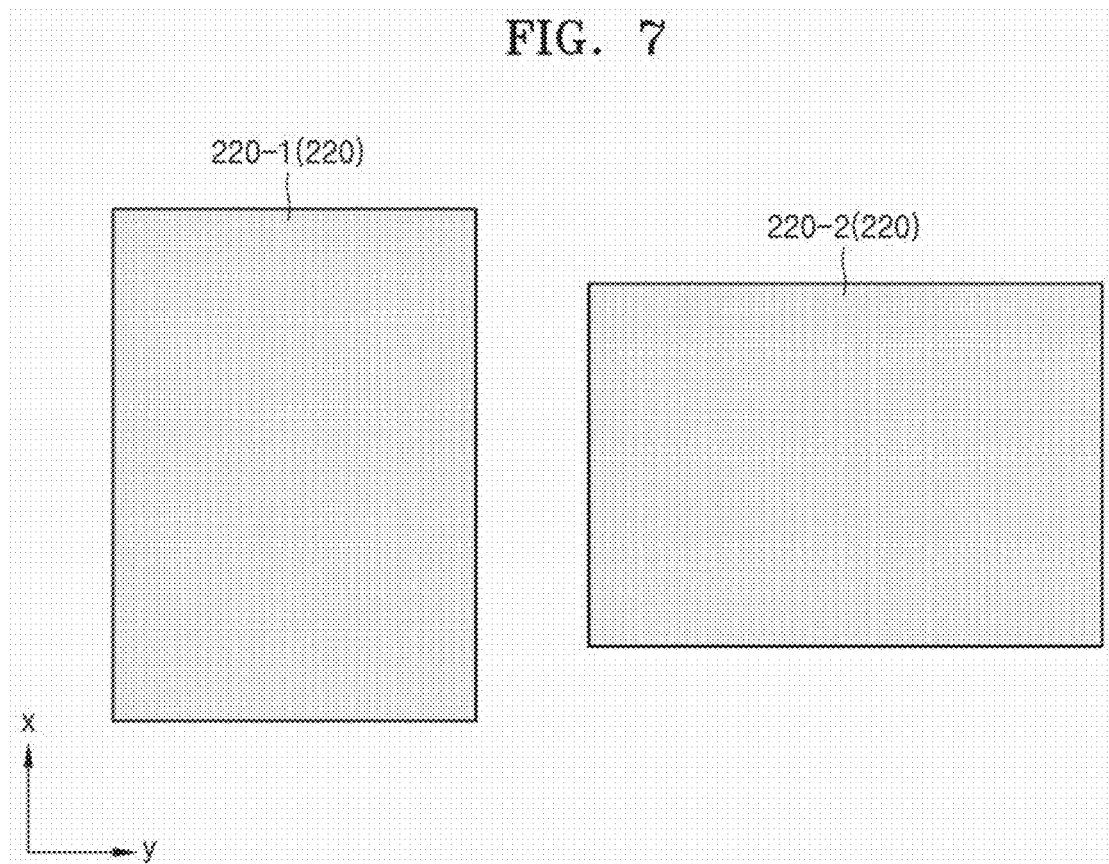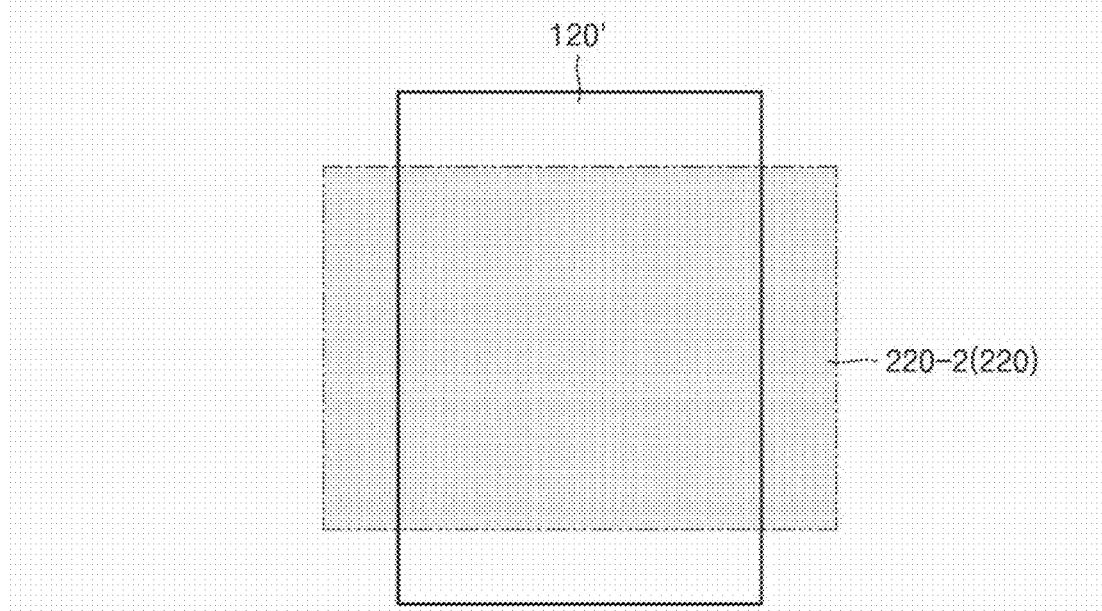

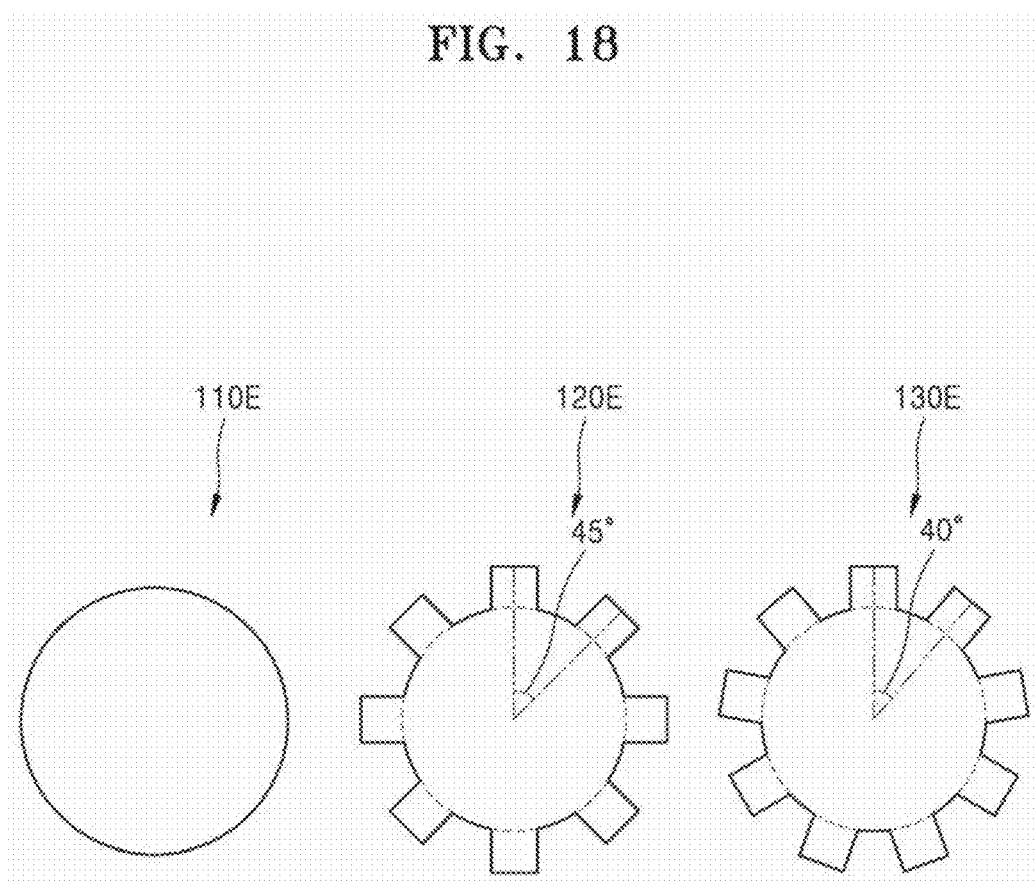

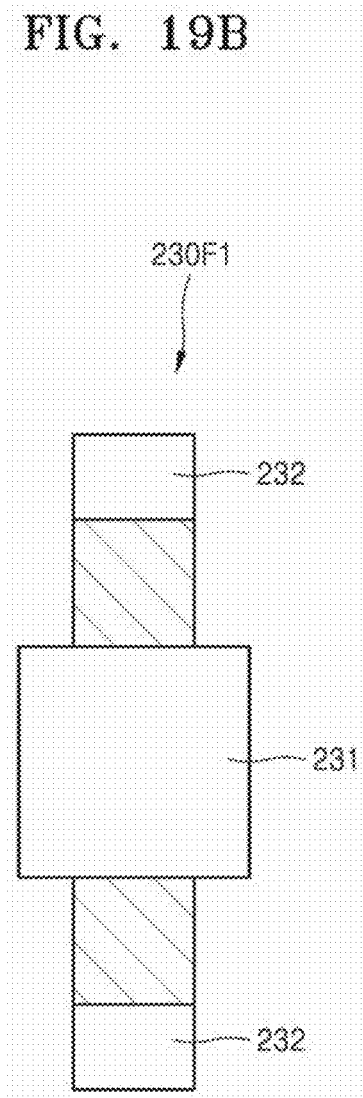

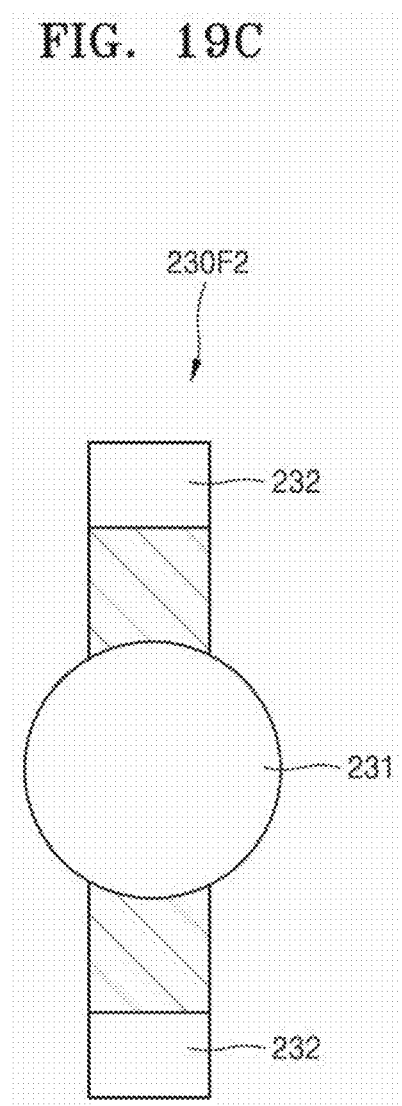

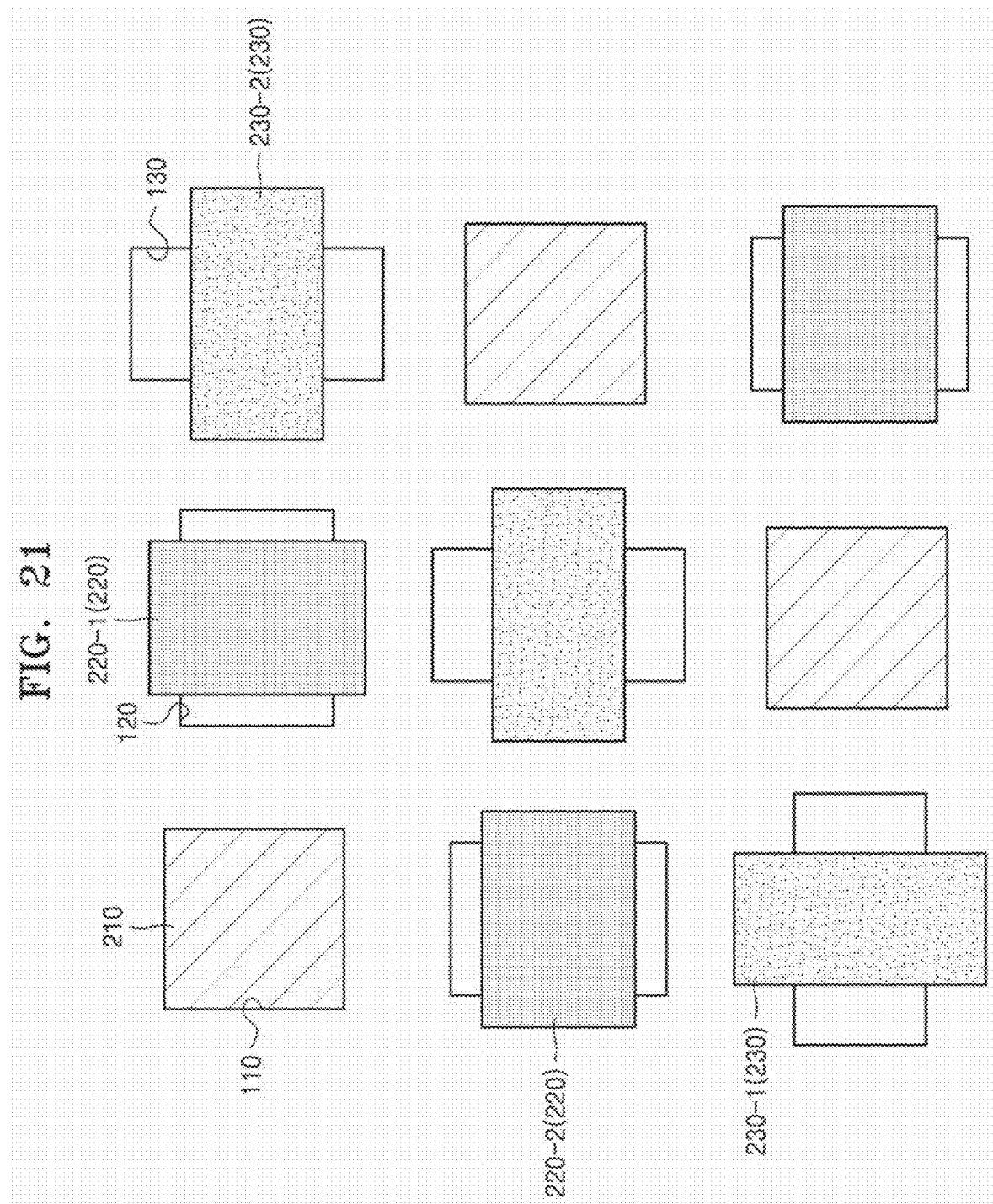

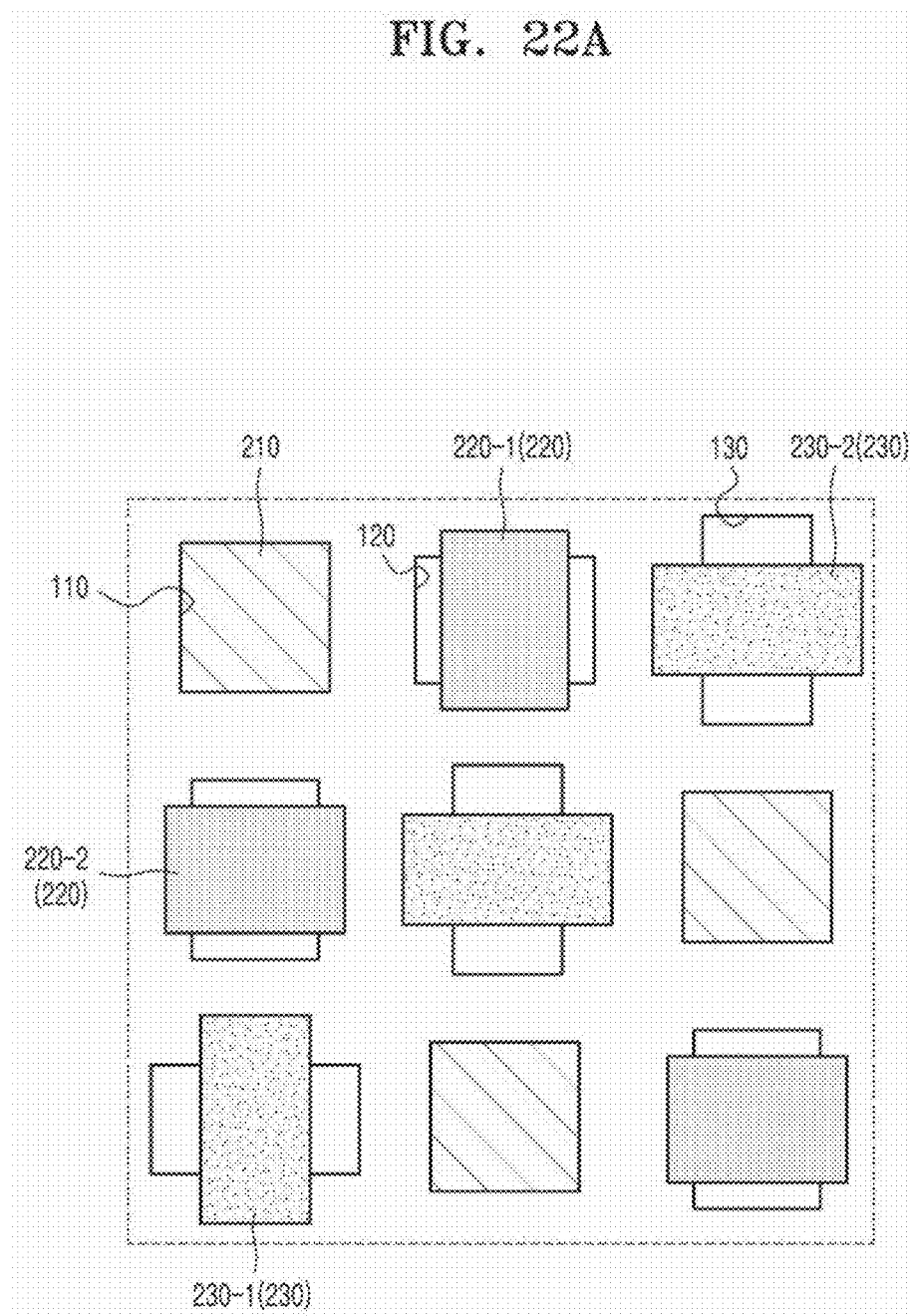

METHOD OF ALIGNING MICRO LIGHT EMITTING ELEMENT AND DISPLAY TRANSFERRING STRUCTURE

CROSS-REFERENCE TO RELATED APPLICATION

This application is based on and claims priority under 35 U.S.C. § 119 to Korean Patent Application No. 10-2020-0102055, filed on Aug. 13, 2020, in the Korean Intellectual Property Office, the disclosure of which is incorporated by reference herein in its entirety.

BACKGROUND

1. Field

Example embodiments relate to a method of aligning micro light emitting elements and a display transferring structure.

2. Description of Related Art

Light emitting diodes (LEDs) have advantages of being eco-friendly and providing low power consumption. Due to these advantages, industrial demand for LEDs is increasing. LEDs have been applied y to lighting devices or LCD backlights, as well as LED display devices. That is, display devices using micro-unit LED chips have been developed.

In manufacturing a micro LED display device, micro LEDs need to be transferred onto a substrate. A pick and place method is widely used as a method of transferring micro LEDs. However, in this method, productivity is low because the micro LEDs have small sizes and a display has a large size.

SUMMARY

Provided is a method of aligning micro light emitting elements.

Provided is a display transferring structure in which micro light emitting elements are aligned.

Additional aspects will be set forth in part in the description which follows and, in part, will be apparent from the description, or may be learned by practice of the presented embodiments of the disclosure.

According to an aspect of an example embodiment, there is provided a method of aligning a plurality of micro light emitting elements, the method including: supplying the plurality of micro light emitting elements on a substrate including a plurality of grooves having different shapes, the plurality of micro light emitting elements being configured to be inserted exclusively and respectively into the plurality of grooves; respectively inserting the plurality of micro light emitting elements into the plurality of grooves; and aligning the plurality of micro light emitting elements, wherein at least one groove of the plurality of grooves has a shape that is different from a shape of a respective micro light emitting element inserted into the at least one groove.

The plurality of grooves may include a first groove having a first shape, a second groove having a second shape that is different from the first shape, and a third groove having a third shape that is different from the first and second shapes, and the plurality of micro light emitting elements may include a first micro light emitting element inserted into the first groove and having a fourth shape, a second micro light emitting element inserted into the second groove and having a fifth shape that is different from the fourth shape, and a third micro light emitting element inserted into the third groove and having a sixth shape that is different from the fourth and fifth shapes, wherein the second shape of the second groove is different from the fifth shape of the second micro light emitting element.

The second micro light emitting element may be configured to be inserted into the second groove in a first posture or in a second posture that is different from the first posture, and the second shape of the second groove may prevent the first and third micro light emitting elements from being inserted into the second groove.

A first region of the second groove into which the second micro light emitting element is inserted in the first posture may partially overlap a second region of the second groove into which the second micro light emitting element is inserted in the second posture.

The second micro light emitting element may have an aspect ratio in which a horizontal length and a vertical length are different from each other.

The second micro light emitting element may face a first direction when inserted in the first posture into the second groove, and the second micro light emitting element may face a second direction different from the first direction when inserted in the second posture into the second groove.

Each micro light emitting element of the plurality of micro light emitting elements may have a shape of a same n-sided polygon and an aspect ratio that is different from aspect ratios of other micro light emitting of the plurality of micro light emitting elements, n being greater than or equal to 3.

Each of the second micro light emitting element and the third micro light emitting element may include a body portion and a protrusion portion protruding from the body portion, and the second micro light emitting element and the third micro light emitting element may be different from each other in at least one of a shape of the body portion, a shape of the protrusion portion, and a position of the protrusion portion.

At least some of the plurality of micro light emitting elements may have an aspect ratio of 1:3 or less.

The plurality of micro light emitting elements may be simultaneously supplied on the substrate.

According to an aspect of an example embodiment, there is provided a display transferring structure including: a substrate including a plurality of first grooves, a plurality of second grooves, and a plurality of third grooves, wherein each first groove of the plurality of first grooves has a first shape, each second groove of the plurality of second grooves has a second shape that is different from the first shape and each third groove of the plurality of third grooves has a third shape that is different from the first and second shapes; and a plurality of first micro light emitting elements inserted into the plurality of first grooves; a plurality of second micro light emitting elements inserted into the plurality of second grooves; and a plurality of third micro light emitting elements inserted into the plurality of third grooves, wherein the second shape of each second micro light emitting element of the plurality of second micro light emitting elements is different from a shape of each second groove of the plurality of second grooves.

Some second micro light emitting elements of the plurality of second micro light emitting elements inserted into the plurality of second grooves may have a first posture, and other second micro light emitting elements of the plurality of second micro light emitting elements may have a second posture that is different from the first posture.

A first region of a second groove into which a second micro light emitting element is inserted in the first posture may partially overlap a second region of the second groove into which the second micro light emitting element is inserted in the second posture.

The second micro light emitting element may have an aspect ratio in which a horizontal length of the second micro light emitting element and a vertical length of the second micro light emitting element are different from each other.

The second micro light emitting element may face a first direction when inserted in the first posture into the second groove, and the second micro light emitting element may face a second direction different from the first direction when inserted in the second posture into the second groove.

Each of the plurality of first micro light emitting elements, each of the plurality of second micro light emitting elements, and each of the plurality of third micro light emitting elements may have a shape of a same n-sided polygon, n being greater than or equal to 3, and each first micro light emitting element of the plurality of first micro light emitting elements may have a first aspect ratio, each second micro light emitting element of the plurality of second micro light emitting elements may have a second aspect ratio that is different from the first aspect ratio, and each third micro light emitting element of the plurality of third micro light emitting elements may have a third aspect ratio that is different from the first and second aspect ratios.

Each second micro light emitting element of the plurality of second micro light emitting elements and each third micro light emitting element of the plurality of third micro light emitting elements may include a body portion and a protrusion portion protruding from the body portion, and the plurality of second micro light emitting elements may be different from the plurality of third micro light emitting elements in at least one of a shape of the body portion, a shape of the protrusion portion, and a position of the protrusion portion.

At least some of the plurality of first micro light emitting elements, the plurality of second micro light emitting elements, and the plurality of third micro light emitting elements may have an aspect ratio of 1:3 or less.

BRIEF DESCRIPTION OF THE DRAWINGS

The above and other aspects, features, and advantages of certain example embodiments of the disclosure will be more apparent from the following description taken in conjunction with the accompanying drawings, in which:

FIG. 6 schematically illustrates shapes of a plurality of grooves according to an example embodiment;

FIG. 7 is a diagram illustrating various postures of a second micro light emitting element;

FIG. 8 is a diagram illustrating a groove according to a comparative example;

FIG. 18 schematically illustrates shapes of a groove according to an example embodiment;

FIGS. 19A, 19B, and 19C schematically illustrate shapes of a micro light emitting element according to an example embodiment;

FIG. 21 illustrates enlarged view of a part of a display transferring structure according to an example embodiment;

FIGS. 22A and 22B schematically illustrate states in which a plurality of micro light emitting elements are aligned in a plurality of grooves according to an example embodiment;

DETAILED DESCRIPTION

Figure 1:
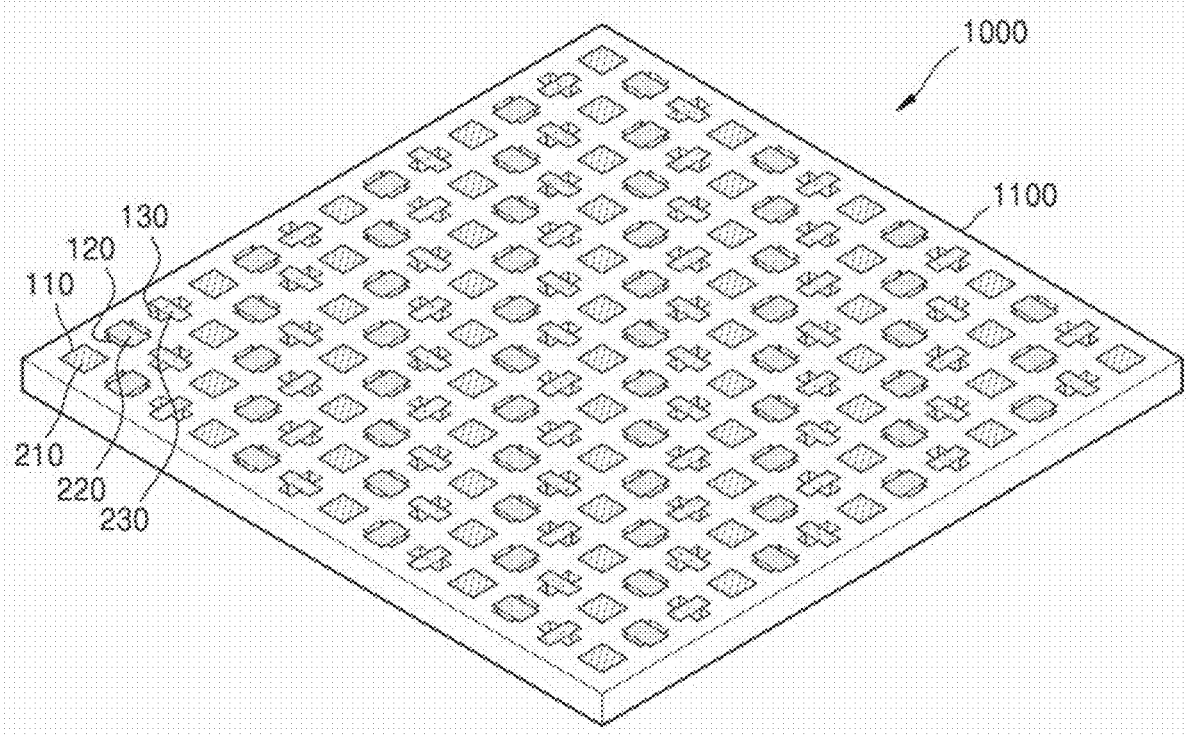
FIG. 1 schematically illustrates a display transferring structure according to an example embodiment.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of,"

when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Hereinafter, a method of aligning micro light emitting elements and a display transferring structure according to various embodiments will be described in detail with reference to the accompanying drawings. In the following drawings, the same reference numerals refer to the same configuration elements, and sizes of respective elements in the drawings may be exaggerated for the sake of clear and convenient description. The terms "first", "second", and the like may be used to describe various configuration elements but configuration elements are not limited by the terms. The terms are only used for the purpose of distinguishing one configuration element from another configuration element.

A singular expression includes plural expressions unless the context clearly indicates otherwise. In addition, when a part is described to "include" a certain configuration element, which means that the part may further include other configuration elements, except to exclude other configuration elements unless otherwise stated. In addition, in the drawings, a size or a thickness of each component may be exaggerated for the sake of clear description. Further, when it is described that a certain material layer exists on a substrate or another layer, the material layer may exist in direct contact with the substrate or another layer, or another third layer may exist therebetween. In addition, in the following examples, materials forming each layer are examples, and other materials may be used.

In addition, the terms such as "unit", "portion", and "module" described in the specification mean units for processing at least one function or operation, which may be implemented by hardware or software, or by a combination of hardware and software.

Certain implementations described in embodiments are examples and do not limit the technical scope in any way. For the sake of brief specification, descriptions of electronic configurations, control systems, software, and other functional aspects of the systems of the related art may be omitted. In addition, connections of lines between configuration elements or connection members illustrated in the drawings represent functional connections and/or physical or circuit connections by way of example and may be replaced or represented as additional various functional connections, physical connections, or circuit connections in the actual device.

The term "above-described" and similar terminology may be used for the singular and the plural.

The steps constituting the method may be performed in any suitable order unless there is a clear statement that the steps should be performed in the order described. In addition, all example terms (for example, and so on) are used simply for the purpose of describing technical concepts in detail, and the scope of claims is not limited by the example terms unless defined by the claims.

FIG. 1 schematically illustrates a display transferring structure 1000 according to an example embodiment.

The display transferring structure 1000 may include a transfer substrate 1100 including a plurality of grooves 110, 120, and 130 and micro light emitting elements 210, 220, and 230 respectively provided in the plurality of grooves 110, 120, and 130. In other words, the micro light emitting element 210 may be provided in groove 110, the micro light emitting element 220 may be provided in groove 120, and the micro light emitting element 230 may be provided in groove 130.

The number of the micro light emitting elements may be tens of thousands or more. The micro light emitting elements 210, 220, and 230 may have a long side having a length of 100 um or less.

There may be three or more types of the micro light emitting elements 210, 220, and 230 arranged on the display transferring structure 1000.

A first micro light emitting element 210 may emit one of red light, green light, and blue light, a second micro light emitting element 220 may emit another of red light, green light, and blue light, and a third micro light emitting element 230 may emit the other of red light, green light, and blue light. For example, the first micro light emitting element 210 may emit red light, the second micro light emitting element 220 may emit green light, and the third micro light emitting element 230 may emit blue light.

The first micro light emitting element 210, the second micro light emitting element 220, and the third micro light emitting element 230 which emit colors different from each other to the plurality of grooves 110, 120, and 130 of the display transferring structure 1000 are arranged repeatedly, through which a color display may be implemented.

A pick and place method using a stamp may be considered as one of methods for aligning the first, second, and third micro light emitting elements 210, 220, 230 on a determined position of the transfer substrate 1100. However, this method has a problem in that, as the number of micro light emitting elements 210, 220, and 230 to be placed increases, a process time increases and an overall yield is reduced.

A self-assembly method may be considered as another method of aligning the first, second, and third micro light emitting elements 210, 220, and 230 on a determined position of the transfer substrate 1100. In the self-assembly method, a plurality of micro light emitting elements 210, 220, and 230 are supplied to the transfer substrate 1100, and appropriate stimuli such as vibration, inclination, and pressure are applied thereto, thereby assembling the plurality of micro light emitting elements 210, 220, and 230 on a certain position of the transfer substrate 1100. However, the self-assembly method may be ideally reduced in process time more than the pick and place method, but a transfer yield is still not satisfactory due to a phenomenon that the micro light emitting elements 210, 220, and 230 are misaligned to other positions or damaged in the process of being aligned.

According to an example embodiment, shapes of the grooves 110, 120, 130 of the transfer substrate 1100 are improved, the shapes of the micro light emitting elements 210, 220, and 230 inserted into and aligned in the grooves 110, 120, and 130 are selectively improved, and thus, the transfer yield of the micro light emitting elements 210, 220, and 230 may be increased.

Figure 2:
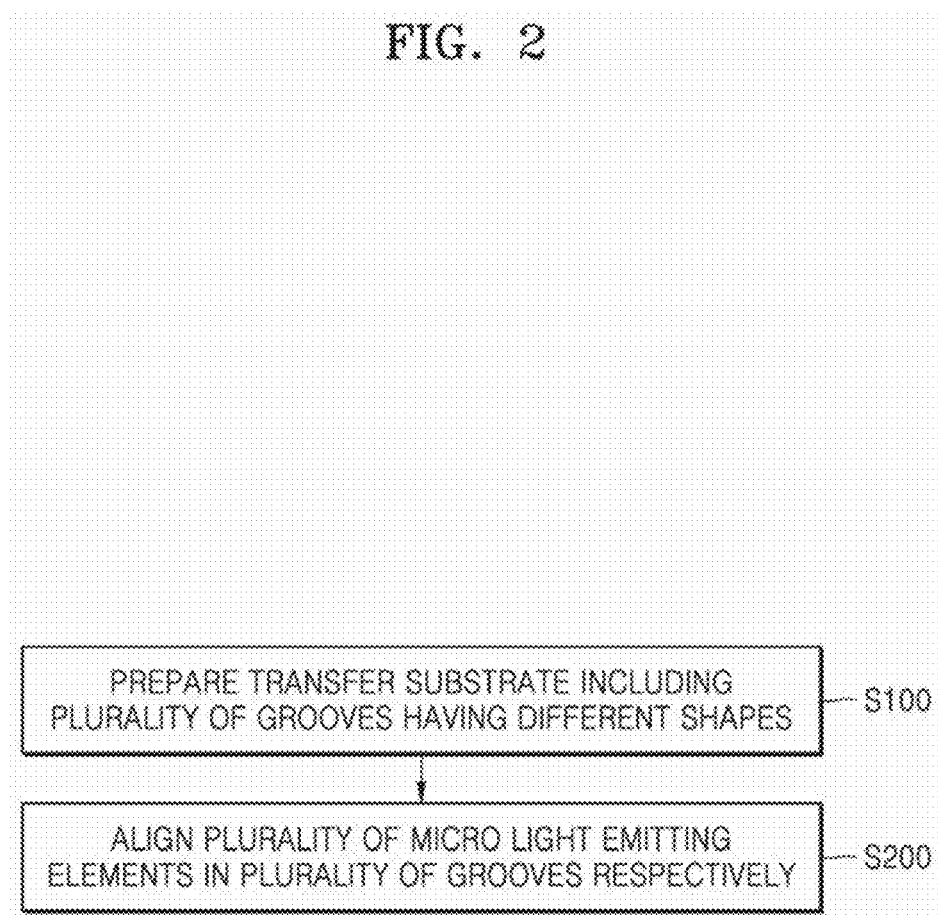
FIG. 2 is a diagram illustrating a method of aligning micro light emitting elements according to an example embodiment.
Figure 3:
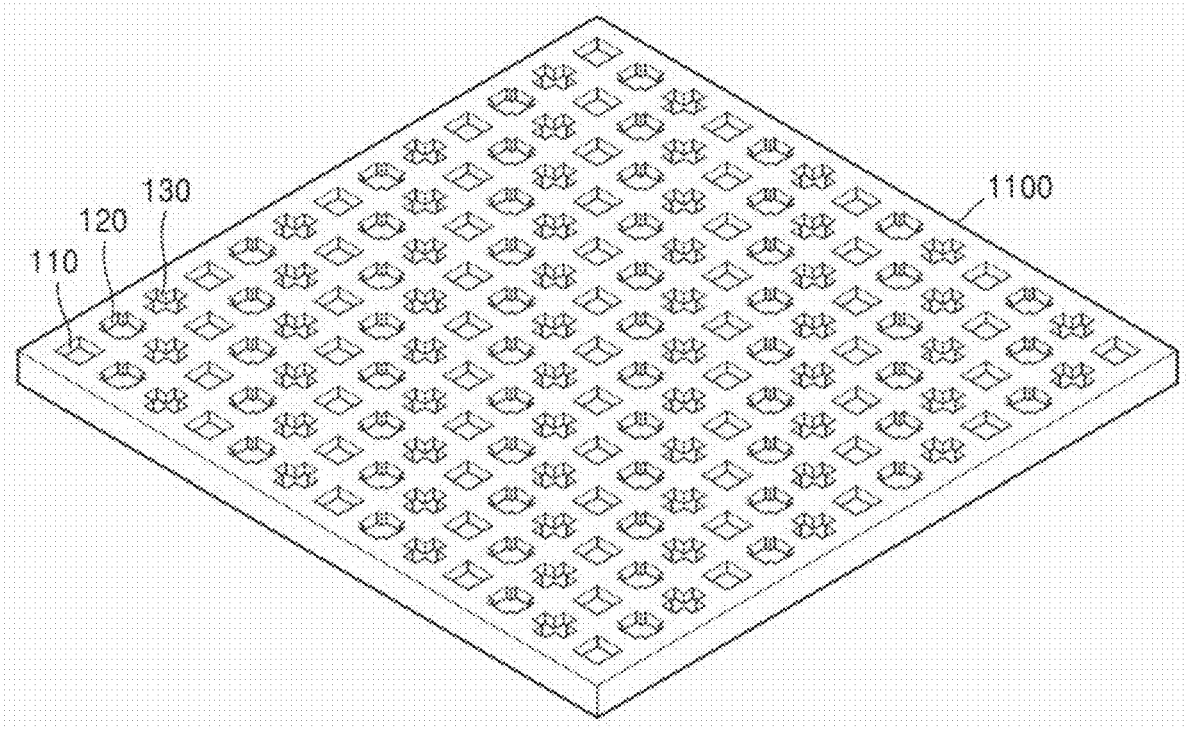
FIG. 3 schematically illustrates a micro light emitting element alignment device according to an example embodiment.
Figure 4A:
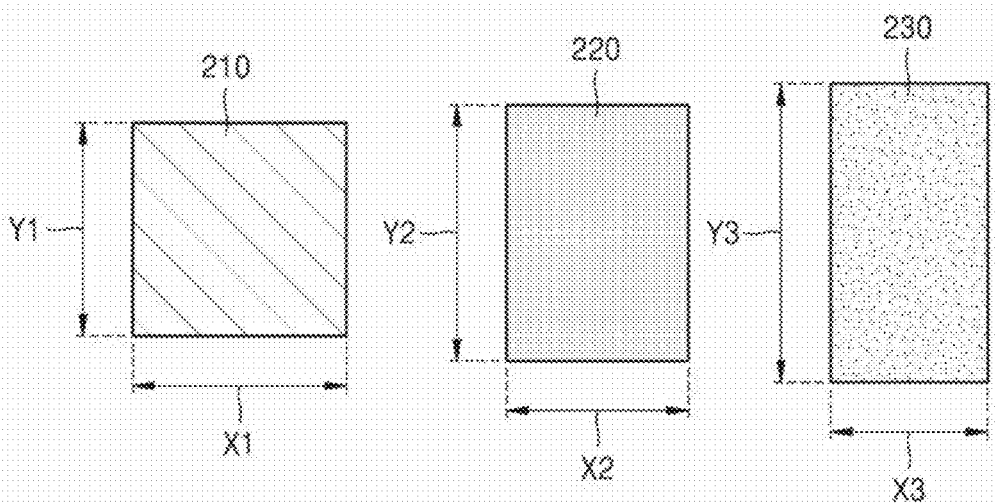
FIGS. 4A, 4B, and 4C schematically illustrate micro light emitting elements according to example embodiments.
Figure 4B:
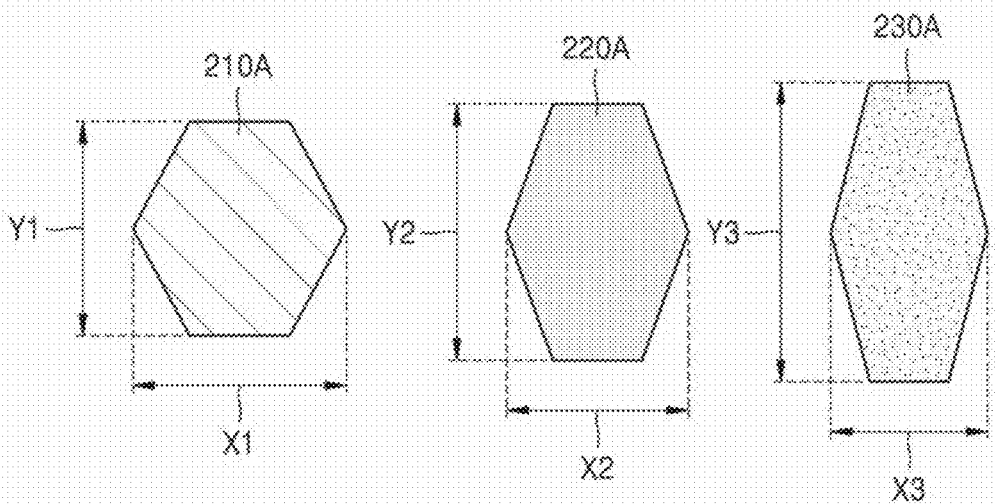
Figure 4C:
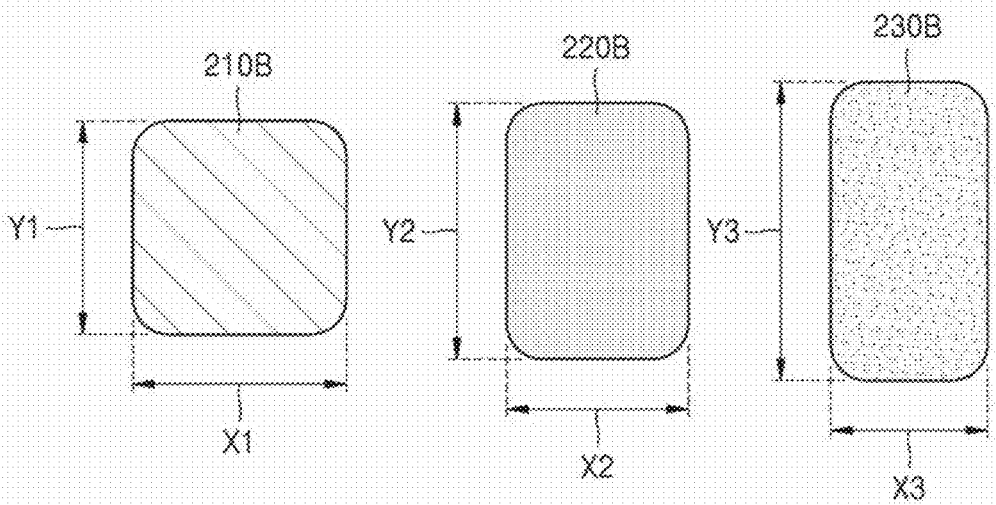
Figure 5:
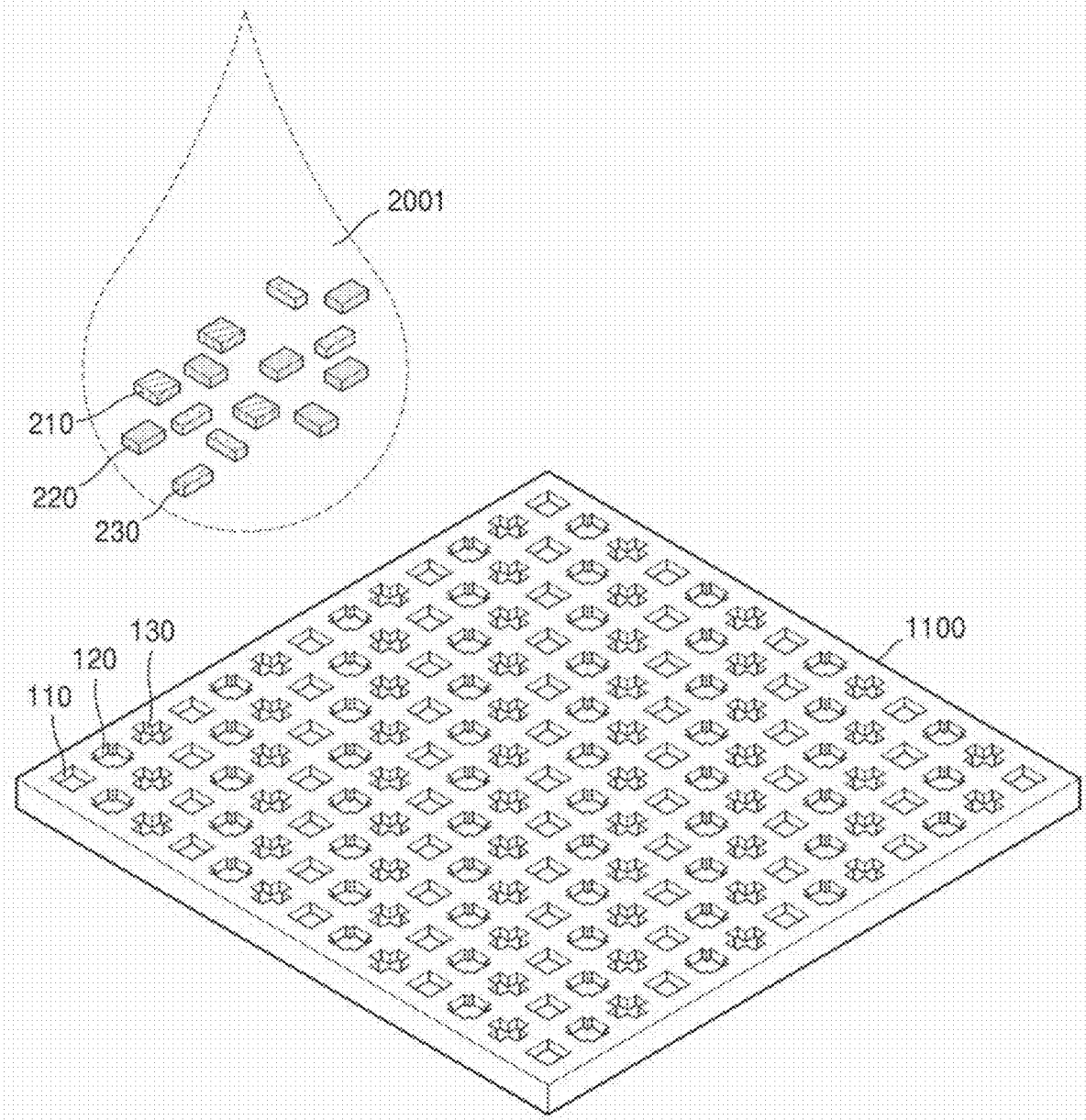
FIG. 5 is a diagram illustrating a method of aligning micro light emitting elements according to an example embodiment.

FIG. 2 is a diagram illustrating a method of aligning micro light emitting elements according to an example embodiment. FIG. 3 schematically illustrates a transfer substrate 1100 according to an example embodiment, FIGS. 4A, 4B, and 4C schematically illustrate micro light emitting elements according to example embodiments, and FIG. 5 is a diagram illustrating a method of aligning micro light emitting elements according to an example embodiment. FIG. 6 schematically illustrates shapes of a plurality of grooves according to an example embodiment, and FIG. 7 is a diagram illustrating various postures of a second micro light emitting element.

A method of aligning micro light emitting elements according to an example embodiment will be described with reference to FIGS. 2 to 7.

The transfer substrate 1100 including the plurality of grooves 110, 120, and 130 is prepared (S100). The transfer substrate 1100 may be provided as a single layer or may include a plurality of layers.

The plurality of grooves 110, 120, and 130 may be provided to align the plurality of micro light emitting elements 210, 220, and 230 at determined positions of the transfer substrate 1100.

For example, the plurality of grooves 110, 120, and 130 may include at least three types of grooves having different shapes. For example, the plurality of grooves 110, 120, and 130 may include a first groove 110, a second groove 120, and a third groove 130 having shapes different from each other. In other words, the first groove 110 may have a first shape, the second groove 120 may have a second shape, and the third groove 130 may have a third shape. The first shape, the second shape, and the third shape may be different from each other. Here, the shape may be a shape of a cross section cut in a direction parallel to the plane of the transfer substrate 1100. Detailed shapes of the first, second, and third grooves 110, 120, and 130 will be described below.

The plurality of micro light emitting elements 210, 220, and 230 are supplied on the transfer substrate 1100 having the plurality of grooves 110, 120, and 130, and the plurality of micro light emitting elements 210, 220, and 230 are inserted into the plurality of grooves 110, 120, and 130 and aligned therein (S200).

The plurality of micro light emitting elements 210, 220, and 230 may be directly sprayed on the transfer substrate 1100 without a liquid or may be supplied by using a material other than a liquid. Alternatively, the plurality of micro light emitting elements 210, 220, and 230 may be supplied to the transfer substrate 1100 in various ways in a state of being included in a suspension. In this case, a method of supplying the micro light emitting elements 210, 220, and 230 may include various method such as a spray method, a dispensing method, an inkjet dot method, and a method of flowing a suspension onto the transfer substrate 1100. The method of supplying the micro light emitting elements 210, 220, and 230 to the transfer substrate 1100 is not limited thereto and may be variously modified. A liquid 2001 (see, e.g., FIG. 5) may be supplied to fit the grooves 110, 120 and 130, or the liquid 2001 may be supplied to overflow from the grooves 110, 120, and 130.

The plurality of micro light emitting elements 210, 220, and 230 may include three types of micro light emitting elements 210, 220, and 230 having different shapes. For example, the plurality of micro light emitting elements 210, 220, and 230 may include a first micro light emitting element 210, a second micro light emitting element 220, and a third micro light emitting element 230 having different shapes.

For example, the first, second, and third micro light emitting elements 210, 220, and 230 may have a shape of the same n-sided polygon but may have aspect ratios different from each other. Here, n may be 3 or more.

As an example, as illustrated in FIG. 4A, a shape of the first micro light emitting element 210 may be a square, a shape of the second micro light emitting element 220 may be a rectangle having an aspect ratio different from an aspect ratio of the shape of the first micro light emitting element 210, and a shape of the third micro light emitting element 230 may be a rectangle having an aspect ratio different from the aspect ratio of the second micro light emitting element 220 and the first micro light emitting element 210. The first micro light emitting element 210 may have a square shape but is not limited thereto and may be a rectangular shape.

For example, a ratio between a horizontal length X1 and a vertical length Y1 of the first micro light emitting element 210 may be 1:1, a ratio between a horizontal length X2 and a vertical length Y2 of the second micro light emitting element 220 may be 3:5, and a ratio between a horizontal length X3 and a vertical length Y3 of the micro light emitting element 230 may be 1:3.

As another example, as illustrated in FIG. 4B, a shape of the first micro light emitting element 210A may be a hexagonal shape, a shape of the second micro light emitting element 220A may be a hexagonal shape having an aspect ratio different from an aspect ratio of the first micro light emitting element 210A, and a shape of the third micro light emitting element 230A may be a hexagonal shape having an aspect ratio different from the aspect ratios of the first and second micro light emitting elements 210A and 220A.

As another example, the plurality of micro light emitting elements may have a shape of an n-sided polygon having rounded corners but may have aspect ratios different from each other. For example, as illustrated in FIG. 4C, the first, second, and third micro light emitting elements 210B, 220B, and 230B may have shapes of rectangles with rounded corners but may have aspect ratios different from each other.

The first, second, and third micro light emitting elements 210, 220, 230 (210A, 220A, 230A) described above have corners having an angle, for example, greater than 60 degrees, and thus, a phenomenon may be reduced in which edges of the micro light emitting elements 210, 220, 230, 210A, 220A, and 230A are damaged while being aligned in the transfer substrate 1100. In addition, when the corners of the micro light emitting elements 210B, 220B, and 230B are round, the phenomenon may be further reduced in which the corners of the micro light emitting elements 210B, 220B, and 230B are damaged.

In the above-described embodiments, an example is provided in which the plurality of micro light emitting elements 210, 220, 230, 210A, 220A, 230A, 210B, 220B, and 230B have a shape of the same n-sided polygon where n is 4 or 6 and have different aspect ratios, but n may be 3, 5, 7, 8 or more without being limited thereto.

Shapes of the micro light emitting elements 210, 220, and 230 may have a structure in which tessellation is possible. For example, one side of each of the micro light emitting elements 210, 220, and 230 may have a structure in contact with one side of each of the adjacent micro light emitting elements 210, 220, and 230. In a step of manufacturing the micro light emitting elements 210, 220, and 230, for example, in a step of growing the micro light emitting elements 210, 220, and 230 on a wafer, the micro light emitting elements 210, 220, and 230 having a structure in which tessellation is possible may be filled in the remaining region except for the outermost region of the wafer. Accordingly, by increasing the number of micro light emitting elements 210, 220, and 230 that may be manufactured per wafer, a manufacturing cost of the micro light emitting elements 210, 220, and 230 may be reduced.

The plurality of micro light emitting elements 210, 220, and 230 may be exclusively inserted into the plurality of grooves 110, 120, and 130, respectively.

For example, the first micro light emitting element 210 may be inserted into the first groove 110 but not inserted into the second groove 120 or the third groove 130. The second micro light emitting element 220 may be inserted into the second groove 120 but not inserted into the first groove 110 or the third groove 130. The third micro light emitting element 230 may be inserted into the third groove 130 but not inserted into the first groove 110 or the second groove 120.

Referring to FIG. 6, a length Y1+α of a long side of the first groove 110 is slightly larger than a length Y1 of a long side of the first micro light emitting element 210 and is smaller than lengths Y2 and Y3 of long sides of the second micro light emitting element 220 and the third micro light emitting element 230. Here, the length Y1+α of the long side of the first groove 110 is slightly larger than the length Y1 of the long side of the first micro light emitting element 210 to secure a gap a such that the first micro light emitting element 210 may be smoothly inserted into the first groove 110. The gap a may be approximately 1 um to 10 um but is not limited thereto and may be changed by considering a tolerance and a process capability.

A length of a short side X1+α of the first groove 110 is slightly larger than a length of a short side X1 of the first micro light emitting element 210 and is larger than length X2 and X3 of short sides of the second micro light emitting element 220 and the third micro light emitting element 230. Here, the long side and the short side respectively represent a relatively long side and a relatively short side, and when all sides have the same length as in a square, the length of the long side may be the same as the length of the short side.

A length of the long side Y2+α of the second groove 120 is slightly larger than a length of the long side Y2 of the second micro light emitting element 220, is larger than the length Y1 of the long side of the first micro light emitting element 210, and is smaller than the length Y3 of the long side of the third micro light emitting element 230.

A length of a short side X2+α of the second groove 120 is slightly larger than the length X2 of the short side of the second micro light emitting element 220, is smaller than the length X1 of the short side of the first micro light emitting element 210, and is larger than the length X3 of the short side of the third micro light emitting element 230.

A length of a long side Y3+α of the third groove 130 is slightly larger than the length of the long side Y3 of the third micro light emitting element 230 and is larger than the lengths Y1 and Y2 of the long sides of the first and second micro light emitting elements.

A length of a short side X3+α of the third groove 130 is slightly larger than the length of the short side X3 of the third micro light emitting element 230 and is smaller than the lengths of the short sides X1 and X2 of the first and second micro light emitting elements 210 and 220.

The first, second, and third micro light emitting elements 210, 220, and 230 may be simultaneously supplied onto the transfer substrate 1100 and aligned therein when the first, second, and third micro light emitting elements 210, 220, and 230 are exclusively inserted into the first, second, and third grooves 110, 120, and 130. As the first, second, and third micro light emitting elements 210, 220, and 230 are simultaneously supplied, a process time may be reduced and a transfer efficiency may be increased, compared to the process of sequentially supplying the first, second, and third micro light emitting elements 210, 220, and 230.

However, the supply of the first, second, and third micro light emitting elements 210, 220, and 230 does not need to be simultaneously performed and may be sequentially performed depending on the selection.

As described above, the plurality of micro light emitting elements 210, 220, and 230 may have a shape of the same n-sided polygon but may have different aspect ratios. In this case, at least some of the micro light emitting elements, for example, the second micro light emitting element 220 and the third micro light emitting element 230 have aspect ratios of different horizontal and vertical lengths.

The second and third micro light emitting elements 220 and 230 having aspect ratios of different horizontal and vertical lengths may have postures facing various directions in a supplying step or an alignment step.

For example, as illustrated in FIG. 7, when a plurality of the second micro light emitting elements 220 are in a state before being inserted into the second groove 120 of the transfer substrate 1100, some of the second micro light emitting elements 220 among the plurality of second micro light emitting elements 220 may have a posture 220-1 facing a first direction, for example, the x-direction, and the other of the second micro light emitting elements 220 may have a second posture 220-2 facing a second direction, for example, the y direction different from the first direction.

FIG. 8 is a diagram illustrating a groove 120' according to a comparative example.

Referring to FIG. 8, in a case in which a shape of the second groove 120' corresponding to the second micro light emitting element 220 is the same as a shape of the second micro light emitting element 220 in the transfer substrate 1100, when a posture of the second micro light emission element 220 is aligned as a second posture 220-2 which is a posture in a different direction from that of the second groove 120', the second micro light emission element 220 is not inserted into the second groove 120'. Accordingly, a probability that the second micro light emitting element 220 is inserted into the second groove 120' is reduced, and a ratio of the second micro light emitting element 220 inserted into the second groove 120' according to the posture of the second micro light emitting element 220 is inconsistent.

In a method of aligning the micro light emitting elements according to the embodiment, at least some of the plurality of grooves 110, 120, and 130 may be different from the shapes of the corresponding micro light emitting elements 210, 220, and 230. Thus, even if postures of the plurality of micro light emitting elements 210, 220, and 230 are changed, a probability is increased of being aligned in the grooves 110, 120, and 130 of the transfer substrate 1100 corresponding thereto.

Some of the plurality of grooves 110, 120, and 130 may have shapes into which corresponding micro light emitting elements may be inserted in various postures. As an example, the first groove 110 may have the same shape as the first micro light emitting element 210, the second groove 120 may have a different shape from that of the second micro light emitting element 220, and the third groove 130 may have a shape different from that of the third micro light emitting element 230. As another example, the first groove 110 may have a shape different from that of the first micro light emitting element 210, the second groove 120 may have a shape different from that of the second micro light emitting element 220, and the third groove 130 may have a shape different from that of the third micro light emitting element 230. Here, when sizes or shapes of the grooves and the micro light emitting elements are slightly changed by considering a manufacturing tolerance, ease of insertion, and so on, for example, when the sizes or shapes are changed in unit of 10 μm or less, the micro light emitting elements may be treated as having the same shape.

Referring to FIGS. 6 and 7, the second groove 120 may have a structure in which the second micro light emitting element 220 may be inserted thereinto in both a first posture 220-1 and a second posture 220-2 different from the first posture 220-1. A first region 121 into which the second micro light emitting element 220 is inserted in the first posture 220-1 in the second groove 120 partially overlaps a second region 122 into which the second micro light emitting element 220 is inserted in the second posture 220-2 in the second groove 120.

The third groove 130 may have a structure in which the third micro light emitting element 230 may be inserted thereinto in both a first posture 230-1 and a second posture 230-2 different from the first posture 230-1. A first region 131 into which the third micro light emitting element 230 is inserted in a first posture 230-1 in the third groove 130 partially overlaps a second region 132 into which the third micro light emitting element 230 is inserted in a second posture 230-2 in the third groove 130.

Figure 9A:
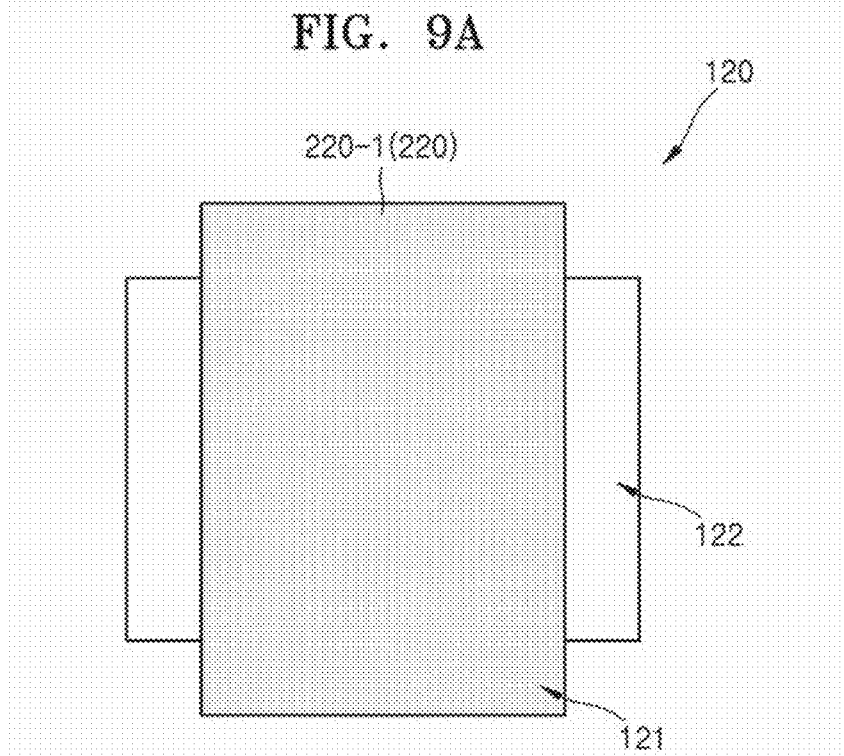
FIGS. 9A and 9B schematically illustrate states in which a second micro light emitting element is inserted into a second groove.
Figure 9B:
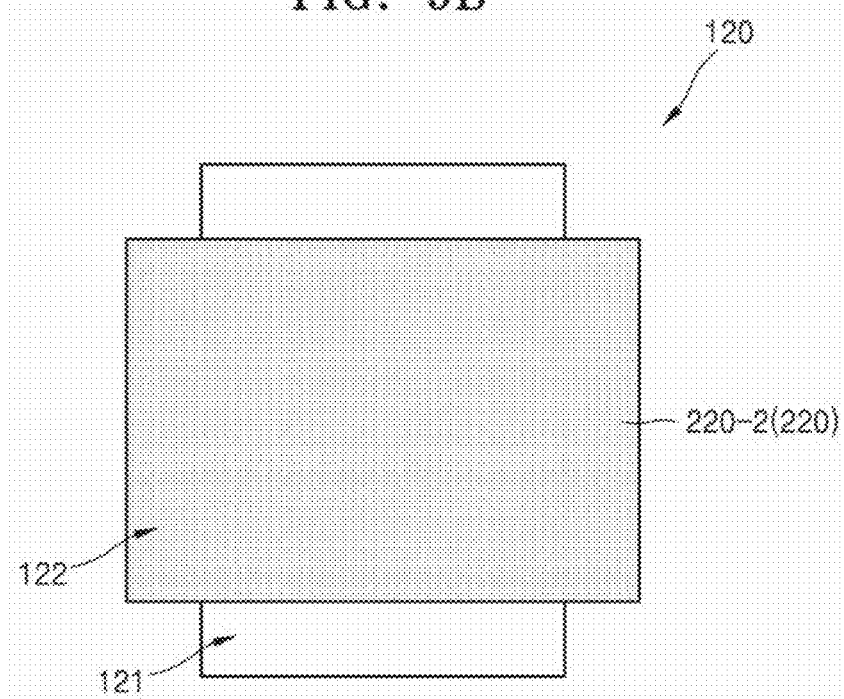

Referring to FIGS. 9A and 9B, the second posture 220-2 may be a state of being rotated by 90 degrees from the first posture 220-1. However, rotation angles of the first and second postures 220-1 and 220-2 are not limited thereto and may be various angles such as 30 degrees, 45 degrees, and 60 degrees.

The second micro light emitting element 220 may be inserted into the second groove 120 even if the second micro light emitting element 220 rotates in an alignment step to have either of the first and second postures 220-1 and 220-2. The third micro light emitting element 230 may be inserted into the third groove 130 even if the third micro light emitting element 230 rotates in an alignment step to have either of the first and second postures 230-1 and 230-2.

Referring back to FIG. 6, the second groove 120 includes a common reception portion 1201 for commonly accommodating the second micro light emitting element 220 no matter what posture the second micro light emitting element 220 has when inserted, and a selection reception portion 1202 for selectively accommodating the second micro light emitting element 220 according to a posture in which the micro light emitting element 220 is inserted. The third groove 130 includes a common reception portion 1301 for commonly accommodating the third micro light emitting element 230 no matter what posture the third micro light emitting element 230 has when inserted, and a selection reception portion 1302 for selectively accommodating the third micro light emitting element 230 according to a position in which the third micro light emitting element 230 is inserted into.

The grooves 110, 120, and 130 may have an exclusive structure in which corresponding micro light emitting elements 210, 220, and 230 can be inserted regardless of posture, and other micro light emitting elements 210, 220, and 230 cannot be inserted.

Figure 10A:
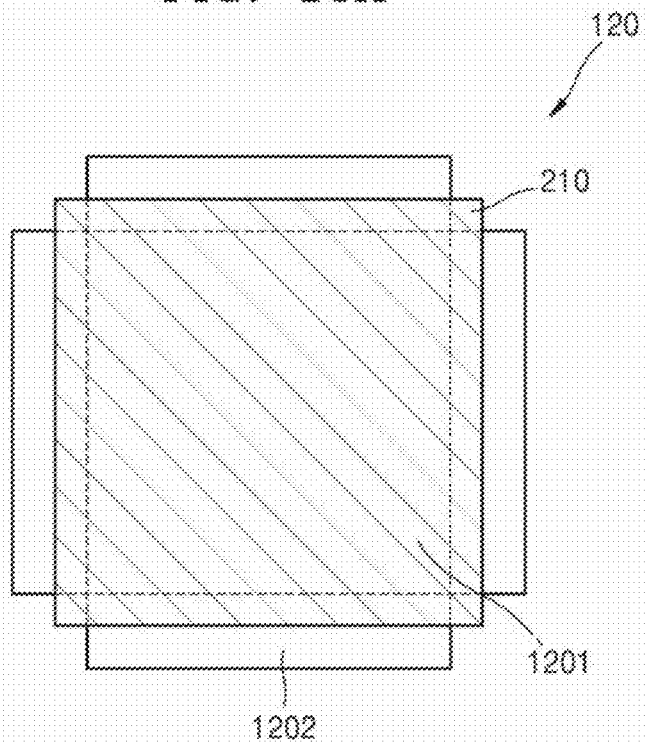
FIGS. 10A and 10B schematically illustrate states in which first and third micro light emitting elements are not inserted into a first groove.
Figure 10B:
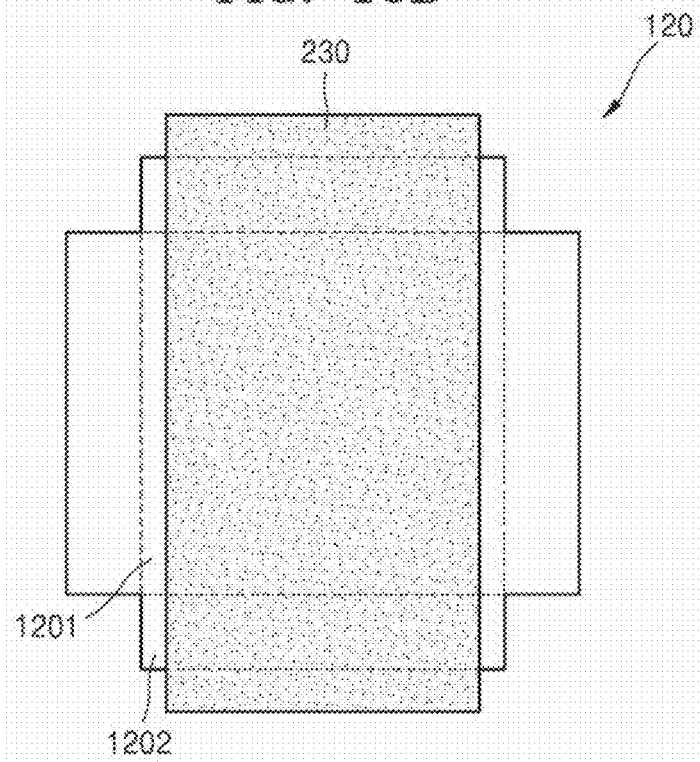

For example, the second groove 120 may be designed so that the second micro light emitting element 220 of various postures may be inserted as illustrated in FIGS. 9A and 9B and the first micro light emitting element 210 and the third micro light emitting element 230 are not inserted as illustrated in FIGS. 10A and 10B. Similarly, the third groove 130 may be designed so that the third micro light emitting element 230 of various postures may be inserted and the first micro light emitting element 210 and the second micro light emitting element 220 are not inserted.

To this end, horizontal and vertical lengths, rotation angles, and so on of the grooves 110, 120, and 130 may be designed by considering horizontal and vertical lengths of the corresponding micro light emitting elements 210, 220, and 230, and horizontal and vertical lengths of the non-corresponding micro light emitting elements 210, 220, and 230. For example, the horizontal and vertical lengths and the rotation angle of the second groove 120 may be designed by considering the horizontal and vertical lengths of the second micro light emitting element 220 corresponding to the second groove 120 and the horizontal and vertical lengths of the first and third micro light emitting elements 210 and 230 not corresponding to the second groove 120.

In the above-described embodiment, FIG. 6 illustrates shapes in which the second groove 120 and the third groove 130 match shapes in which the second and third micro light emitting devices 220 and 230 are rotated by 90 degrees with respect to a fixed rotation axis, but the embodiment is not limited thereto and may be variously modified.

Figure 11A:
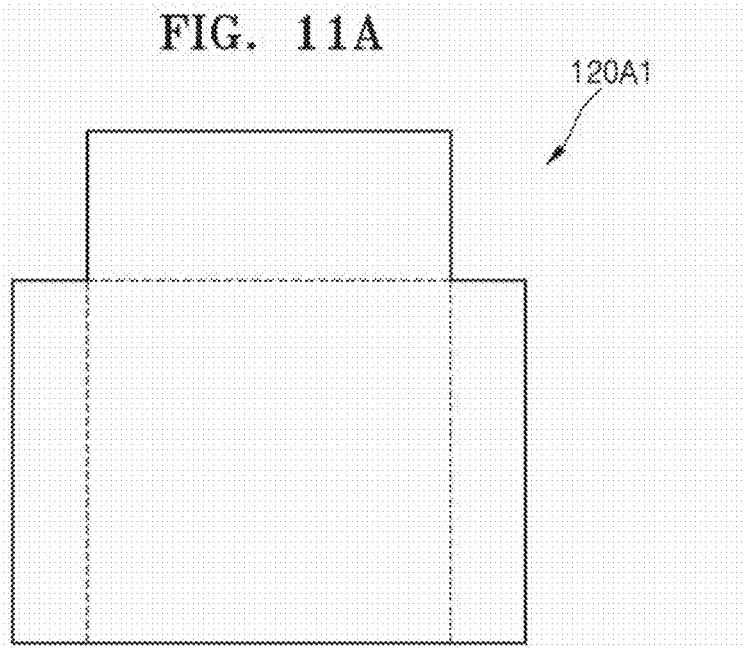
FIGS. 11A, 11B, and 11O are diagrams illustrating shapes of the second groove according to an example embodiment.
Figure 11B:
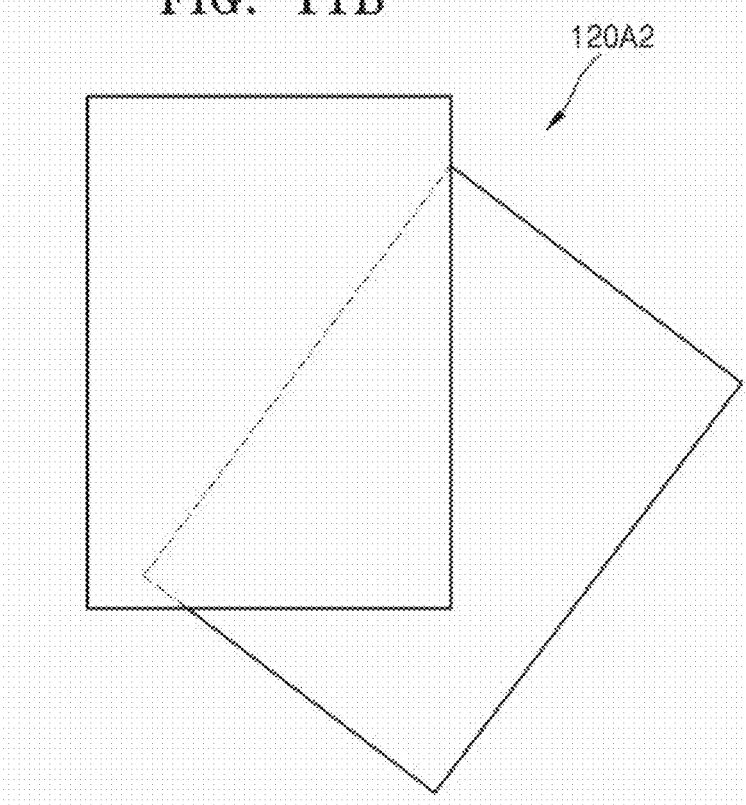
Figure 11C:
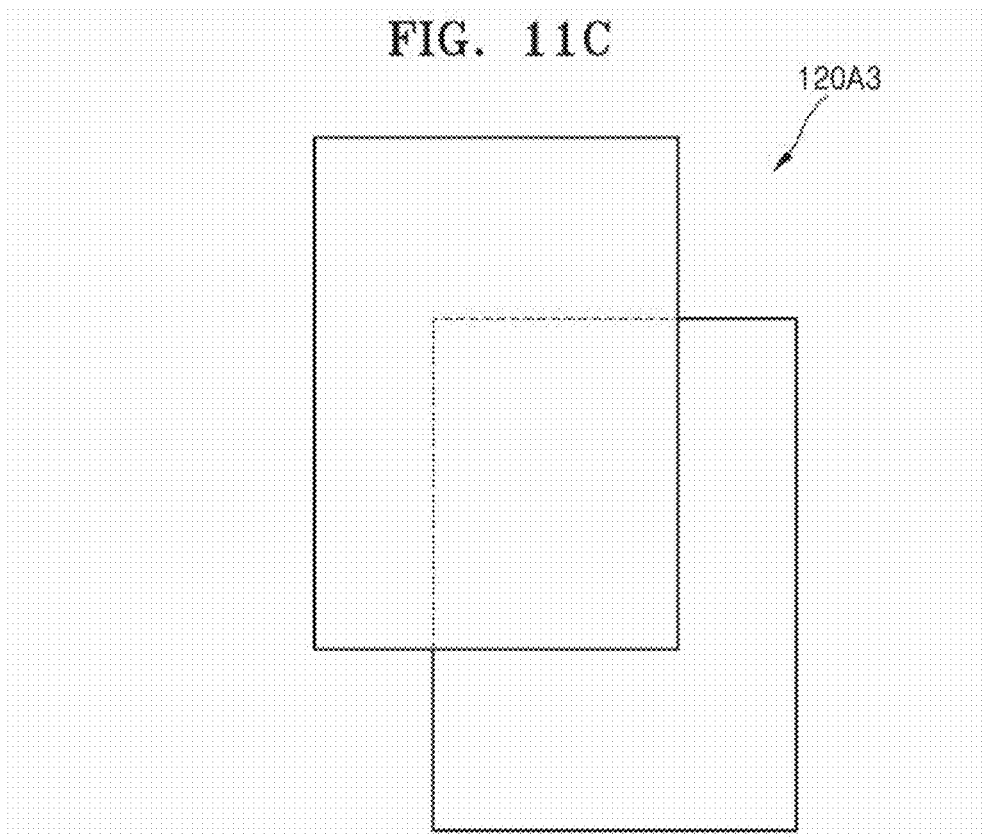

For example, each of second grooves 120A1, 120A2, and 120A3 may have a shape matching a shape made when the second micro light emitting element 220 rotates by 90 degrees while moving, as illustrated in FIG. 11A, may have a shape matching a shape made when the second micro light emitting element 220 rotates at a different angle while moving, as illustrated in FIG. 11B, or may have a shape matching a shape made when the second micro light emitting element 220 moves without rotation, as illustrated in FIG. 11C.

In addition, in the above-described embodiment, an example is described in which the first, second, and third micro light emitting elements 210, 220, and 230 have the same n-sided polygon but is not limited thereto and may be variously modified if different shapes are used, and accordingly, shapes of the first, second, and third grooves 110, 120, and 130 into which the first, second, and third micro light emitting elements 210, 220, and 230 are exclusively inserted may be modified in various ways.

Figure 12:
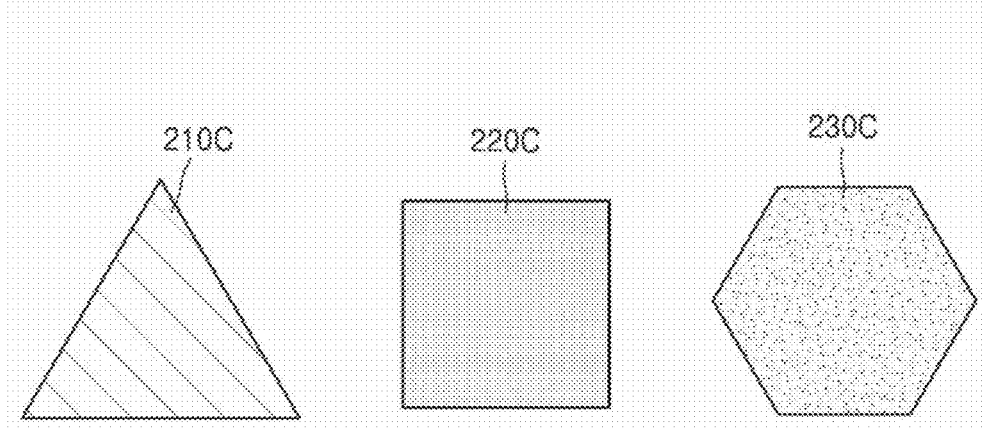
FIG. 12 schematically illustrates shapes of a micro light emitting element according to an example embodiment.
Figure 13A:
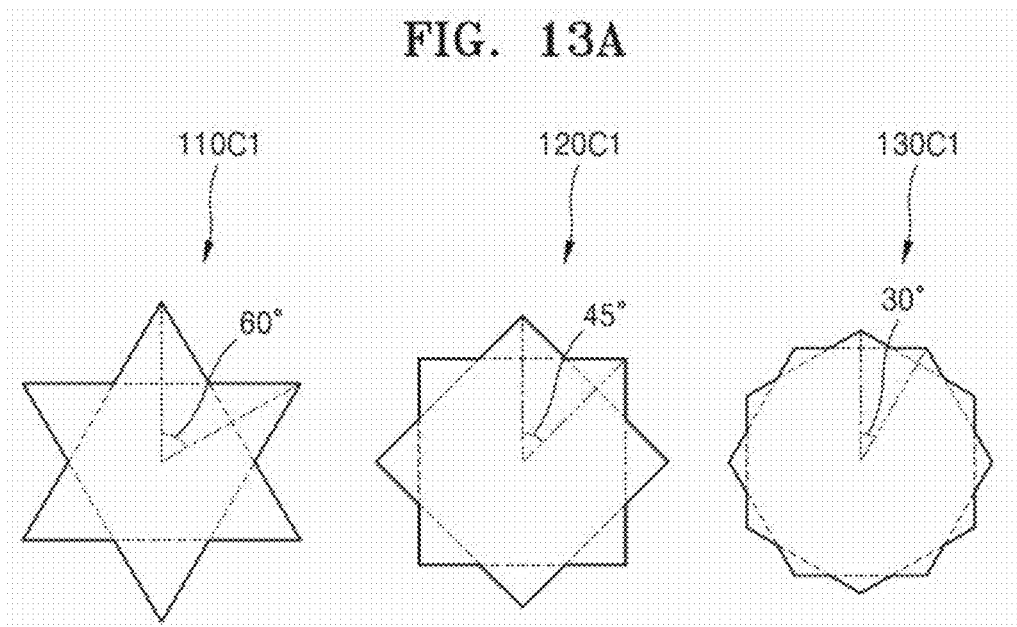
FIGS. 13A, 13B, and 13C schematically illustrate shapes of a groove according to an example embodiment.

As an example, as illustrated in FIG. 12, a shape of a first micro light emitting element 210C may be a triangle, a shape of a second micro light emitting element 220C may be a square, and a shape of a third micro light emitting element 230C may be a hexagon. Referring to FIG. 13A, a first groove 110C1 into which the first micro light emitting element 210C is inserted may have a shape matching a shape in which the first micro light emitting element 210C is rotated by 60 degrees, a second groove 120C1 into which the second micro light emitting element 220C is inserted may have a shape matching a shape in which the second micro light emitting element 220C is rotated by 45 degrees, and a third groove 130C1 into which the third micro light emitting element 230C is inserted may have a shape matching a shape in which the third micro light emitting element 230C is rotated by 30 degrees.

Figure 13B:
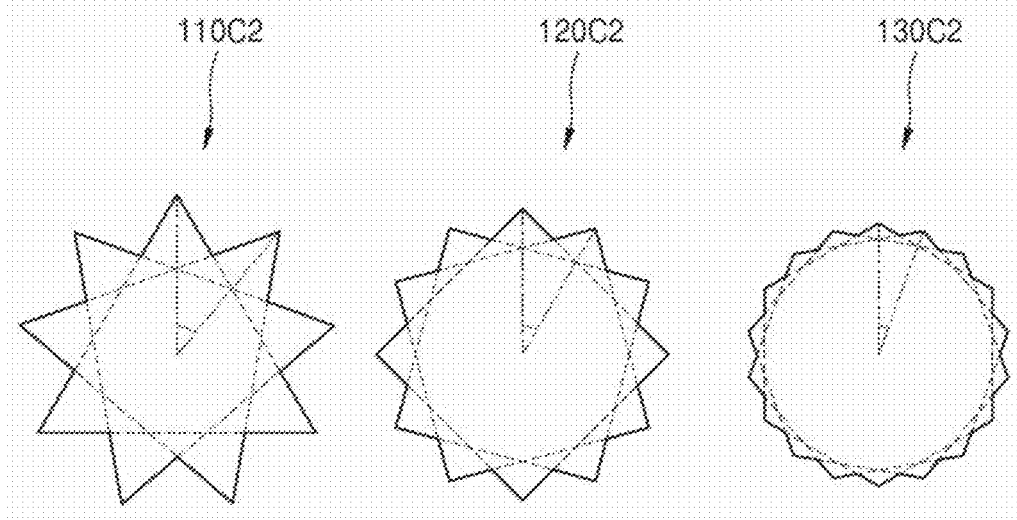
Figure 13C:
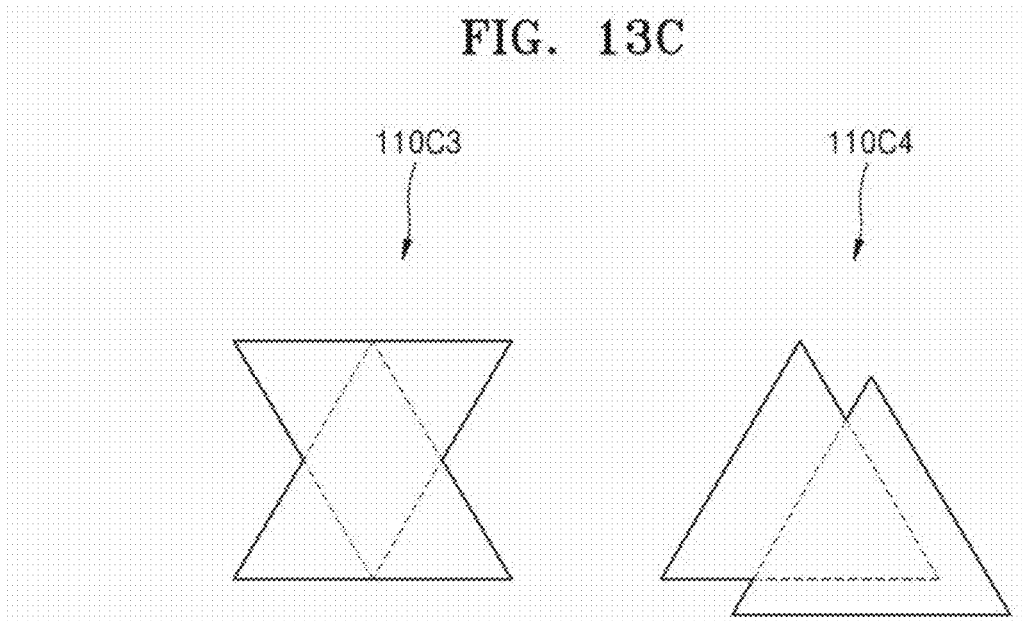

However, the shapes of the first groove 110C1, the second groove 120C1, and the third groove 130C1 are not limited thereto and may be variously modified. For example, as illustrated in FIG. 13B, a first groove 110C2, a second groove 120C2, and a third groove 130C2 may have different shapes by considering various rotation angles of the first, second, and third micro light emitting elements 210C, 220C, and 230C. In addition, as illustrated in FIG. 13C, first grooves 110C3 and 110C4 may have a shape matching a shape in which the first micro light emitting element 210 rotates while moving or may have a shape matching a shape in which the first micro light emitting element 210 moves without rotation. In FIG. 13C, the first grooves 110C3 and 110C4 are mainly illustrated for the sake of convenient description, but the second grooves 120C1 and 120C2 and the third grooves 130C1 and 130C2 may be designed in various shapes in the same manner as the first grooves 110C1, 110C2, 110C3, and 110C4.

As another example, at least some of the first, second, and third micro light emitting elements 210, 220, and 230 may have an atypical shape. For example, as illustrated in FIG.

14, a first micro light emitting element 210D includes a first body portion 2101 of a square and a plurality of first protrusion portions 2102 protruding from the first body portion 2101. A second micro light emitting element 220D includes a second body portion 2201 of a square and a plurality of second protrusion portions 2202 protruding from the second body portion 2201. The first body portion 2101 and the second body portion 2201 may have the same shape or the same n-sided polygon, and the first protrusion portion 2101 and the second protrusion portion 2202 may have different shapes. A third micro light emitting element 230D includes a third body portion 2301 of a hexagon and a plurality of third protrusion portions 2302 protruding from the third body portion 2301. The third body portion 2301 may have a different shape from the first and second body portions 2101 and 2201, and the third protrusion portion 2302 may have a different shape from the first and second protrusion portions 2102 and 2202.

The first, second, and third micro light emitting elements 210D, 220D, and 230D may be variously modified when having mutually exclusive shapes. For example, the first, second, and third micro light emitting elements 210D, 220D, and 230D may have at least some different from each other among shapes of the body portions and shapes of the protrusion portions.

Figure 15:
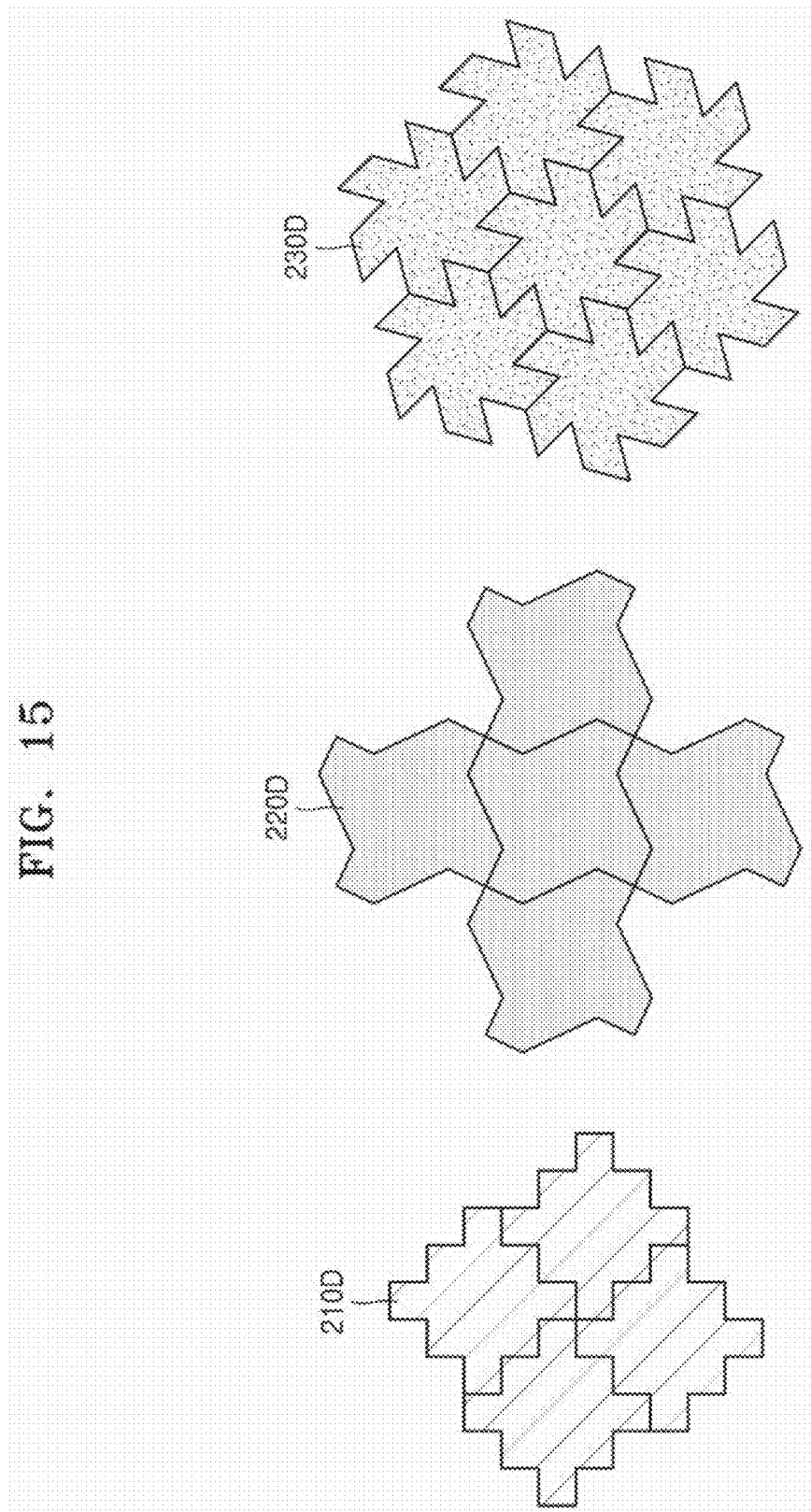
FIG. 15 is a diagram illustrating a tessellation of the micro light emitting element of FIG. 14.

The body portions 2101, 2201, and 2301 and the protrusion portions 2102, 2202, and 2302 of the first, second, and third micro light emitting elements 210D, 220D, and 230D may be designed such that tessellation may be possible as illustrated in FIG. 15.

Figure 16:
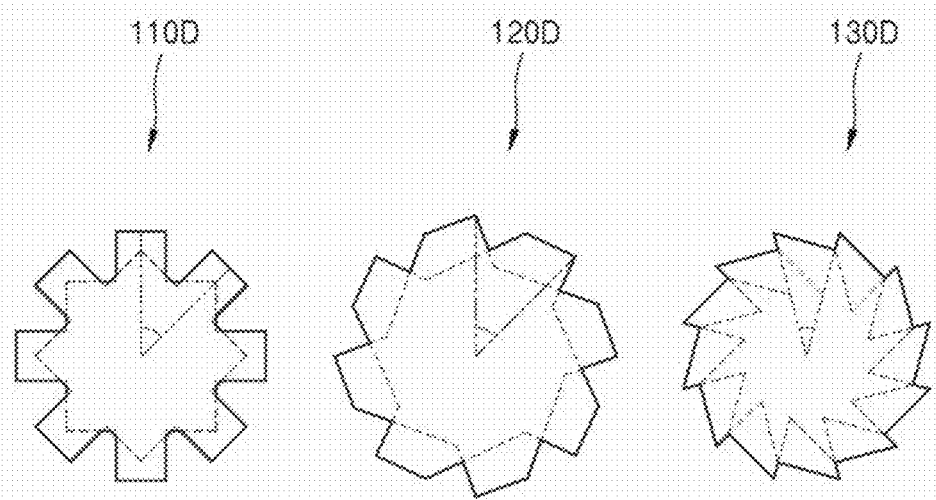
FIG. 16 schematically illustrates shapes of a groove according to an example embodiment.

Referring to FIG. 16, a first groove 110D into which the first micro light emitting element 210D is inserted may have a shape matching a shape when the first micro light emitting element 210D is rotated, a second groove 120D into which the second micro light emitting element 220D is inserted may have a shape matching a shape when the second micro light emitting element 220D is rotated, and a third groove 130D into which the third micro light emitting element 230D is inserted may have a shape matching a shape when the micro light emitting element 230D is rotated.

Figure 14:
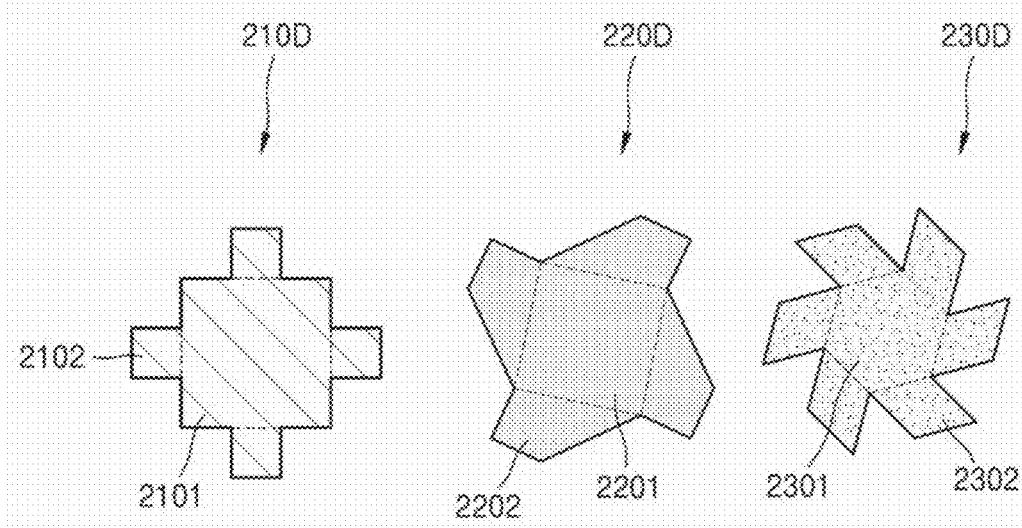
FIG. 14 schematically illustrates shapes of a micro light emitting element according to an example embodiment.

In FIGS. 14 to 16, examples are described wherein the first, second, and third micro light emitting elements 210D, 220D, and 230D have different shapes, the shapes of the body portions 2101, 2201, and 2301 are different from each other, or an the shapes of the protrusion portions 2102, 2202, and 2302 are different from each other. However, shapes of the atypical first, second, and third micro light emitting elements 210, 220, and 230 are not limited thereto and may be various.

Figure 17:
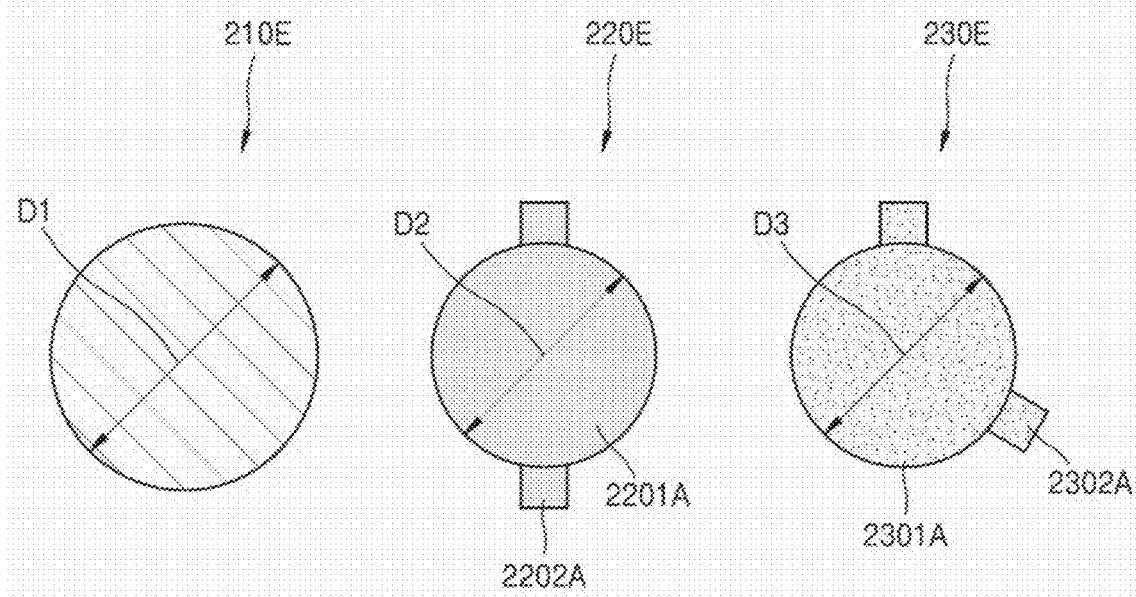
FIG. 17 schematically illustrates shapes of a micro light emitting element according to an example embodiment.

For example, as illustrated in FIG. 17, a shape of a first micro light emitting element 210E is circular, a second micro light emitting element 220E includes a second body portion 2201A having a circular shape and a second protrusion portion 2202A protruding from the second body portion 2201A, and a third micro light emitting element 230E includes a third body portion 2301A having a circular shape and a third protrusion portion 2302A protruding from the third body portion 2301A. A diameter D1 of the first micro light emitting element 210E is larger than diameters D2 and D3 of the second and third body portions 2201A and 2301A, and positions of the second protrusion portion 2202A and the third protrusion portion 2302A may be different from each other. For example, an angle between the second protrusion portions 2202A of the second micro light emitting element 220E is 180 degrees, and an angle between the third protrusion portions 2302A of the third micro light emitting element 230E is 120 degrees. However, the angle between the second protrusion portions 2202A and the angle between the third protrusion portions 2302A are not limited thereto, and various angle combinations may be possible.

Referring to FIG. 18, a first groove 110E into which the first micro light emitting element 210E is inserted may have a shape matching a shape of the first micro light emitting element 210E, a second groove 120E into which the second micro light emitting element 220E is inserted may have a shape matching a shape when the second micro light emitting element 220E is rotated, and a third groove 130E into which the third micro light emitting element 230E is inserted may have a shape matching a shape when the third micro light emitting element 230E is rotated.

As described above, in the plurality of atypical micro light emitting elements 210D, 220D, 230D, 210E, 220E, and 230E, at least one of the shape of the body portion, the shape of the protrusion portion, and the position of the protrusion portion may be different from each other.

The above-described embodiments are mainly described on alignment of three types of micro light emitting elements that emit red light, green light, and blue light but are not limited thereto and may also be applied to a structure in which micro light emitting elements of one type are rotatably arranged.

Figure 19A:
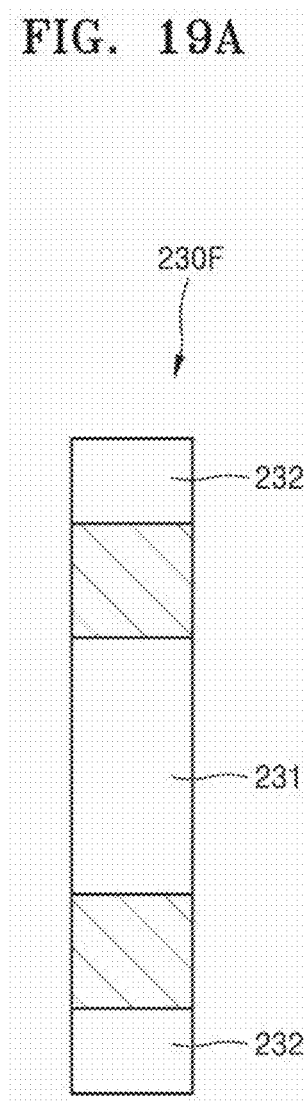

Micro light emitting elements 230F, 230F1, and 230F2 according to another example embodiment may have an aspect ratio less than or equal to a certain size. For example, the micro light emitting element 230F may have an elongated shape having an aspect ratio of 1:3 or less, as illustrated in FIG. 19A. As an example, a ratio between a horizontal length and a vertical length of the micro light emitting element 230F as shown in FIG. 19A may be 1:3. As another example, the ratio between the horizontal length and the vertical length of the micro light emitting element 230F may be 1:4. As another example, the ratio between the horizontal length and the vertical length of the micro light emitting element 230F may be 1:5. An aspect ratio of the micro light emitting element 230F may be 1:10 or more.

The micro light emitting element 230F may have a sufficient distance between electrodes 231 and 232 in a structure having a small size due to the elongated shape thereof, and thus, a process difficulty may be reduced.

Figure 20:
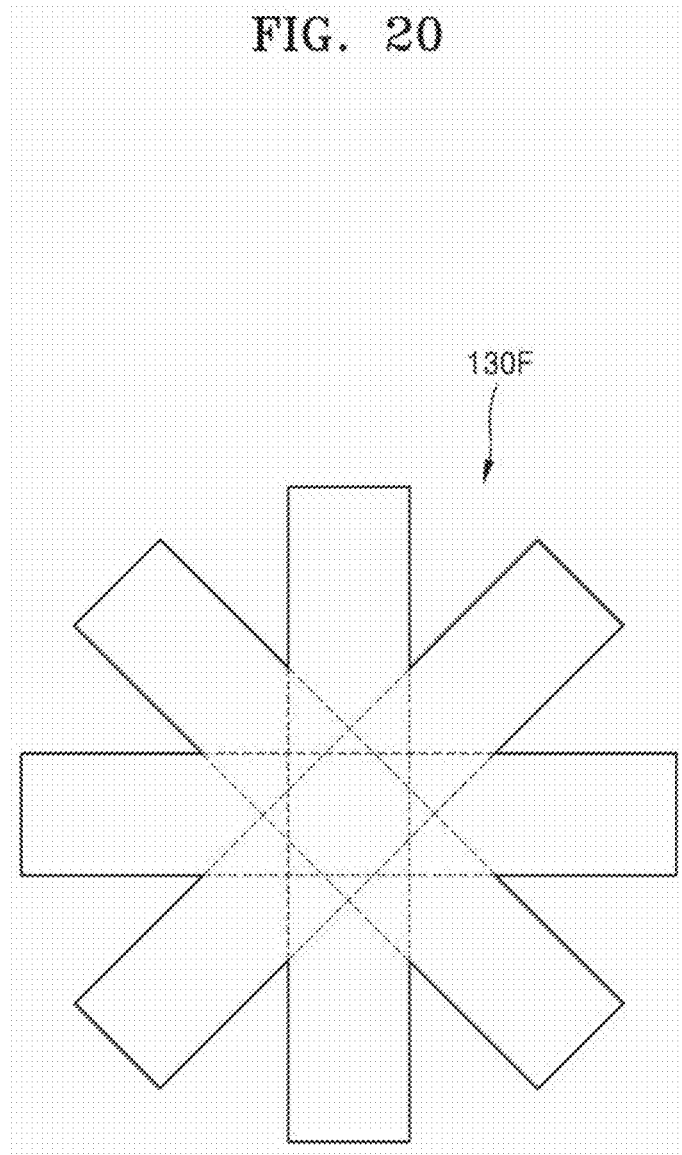
FIG. 20 schematically illustrates a shape of a groove according to an example embodiment.
Figure 22B:
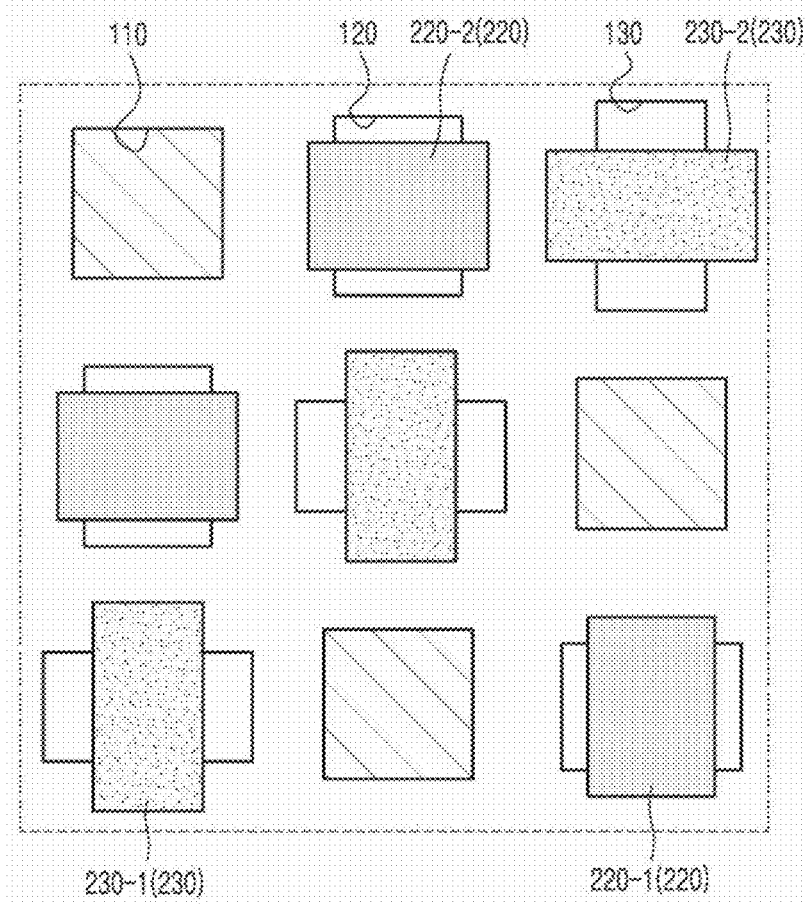

Referring to FIG. 20, a groove 130F may have a different shape from the micro light emitting element 230F so that the micro light emitting element 230F may be inserted in various postures. Accordingly, even when the elongated micro light emitting element 230F has directionality, a probability that the elongated micro light emitting element 230F is inserted into the groove 130F may be increased.

As described above, the groove 130F is designed to have a shape into which the micro light emitting element 230F of various postures may be inserted, which may increase a degree of freedom in design of the micro light emitting element 230F.

For example, not only the micro light emitting element 230F illustrated in FIG. 19A but also the micro light emitting elements 230F1 and 230F2 illustrated in FIGS. 19B and 19C may be inserted into the same groove 130F disclosed in FIG. 20. As described above, when the shape of the groove 130F is different from the shape of the micro light emitting element 230F, the micro light emitting elements 230F1 and 230F2 may be inserted into the corresponding grooves 130F even if the shapes of the micro light emitting elements 230F1 and 230F2 are changed as illustrated in FIGS. 19B and 19C as necessary.

According to the method of aligning the micro light emitting elements described above, the plurality of micro light emitting elements 210, 220, and 230 may be randomly arranged in various postures in the corresponding grooves 110, 120, and 130.

For example, as illustrated in FIG. 21, some of the second micro light emitting elements 220 are arranged in corresponding second grooves 120 in the first posture 220-1, and the other of the second micro light emitting elements 20 are arranged in the other of the second groove 120 in the second posture 220-2. In addition, some of the third micro light emitting elements 230 are arranged in corresponding third grooves 130 in the first posture 230-1, and the other of the third micro light emitting elements 230 are arranged in the other of the third grooves 130 in the second posture 230-2.

The arrangement of the micro light emitting elements may appear in various combinations. Accordingly, states in which the first, second, and, and third micro light emitting elements 210, 220, and 230 are arranged in the first, second, and third grooves 110, 120, and 130 in a partial region A of the display transferring structure 1000 may be different from states in which the first, second, and third micro light emitting elements 210, 220, 230 are arranged in the first, second, and third grooves 110, 120, 130 in the other region B. As such, the states in which the first, second, and third micro light emitting elements 210, 220, and 230 are arranged differently may appear not only in different regions of the same display transferring structure 1000, but also between different display transferring structures 1000.

Figure 23:
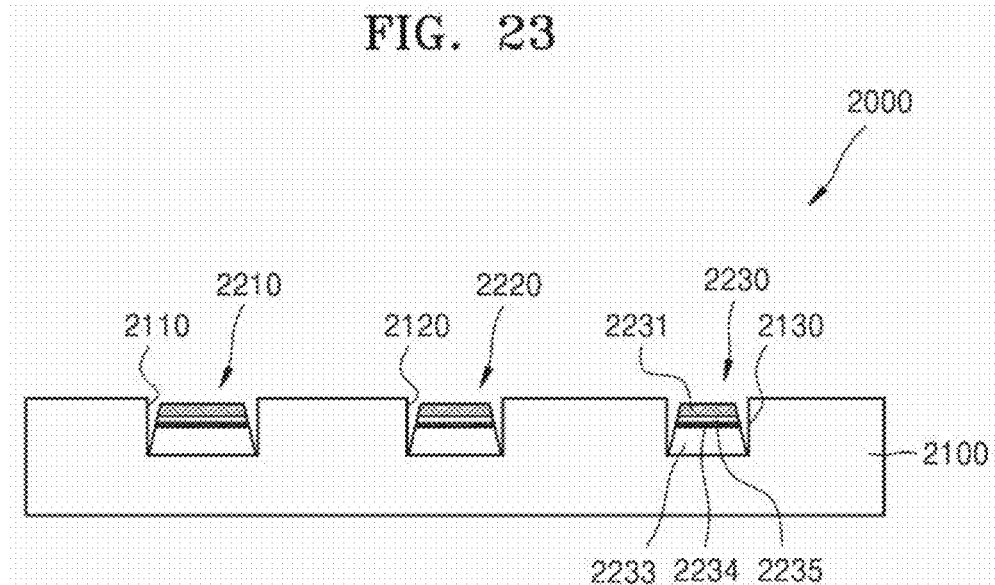
FIGS. 23 to 25 are cross-sectional views of a display transferring structure according to an example embodiment.

FIG. 23 is a diagram illustrating a display transferring structure 2000 according to an example embodiment.

The display transferring structure 2000 aligned by a method of aligning micro light emitting elements according to an example embodiment may include a transfer substrate 2100 having a plurality of grooves 2110, 2120, and 2130, and micro light emitting elements 2210, 2220, and 2230 located at the plurality of grooves 2110, 2120, and 2130. Each of the micro light emitting elements 2210, 2220, and 2230 may include at least one electrode 2231 on a surface thereof facing an upper opening. In addition, an electrode is not provided on a surface of each of the micro light emitting elements 2210, 2220, and 2230 facing a bottom of each of the plurality of grooves 2110, 2120, and 2130.

At least one electrode 2231 may be, for example, a negative electrode. Alternatively, at least one electrode 2231 may be, for example, a positive electrode. At least one electrode 2231 may be located toward the upper opening of each of the grooves 2110, 2120, and 2130.

The micro light emitting elements 2210, 2220, and 2230 may include, for example, an n-type semiconductor layer 2233, an active layer 2234, and a p-type semiconductor layer 2235. The n-type semiconductor layer 2233 may be, for example, an n-type GaN layer, and the p-type semiconductor layer 2235 may be a p-type GaN layer. The active layer 2234 may have, for example, a quantum well structure or a multiple quantum well structure. However, the micro light emitting elements 2210, 2220, and 2230 are not limited thereto.

Figure 24:
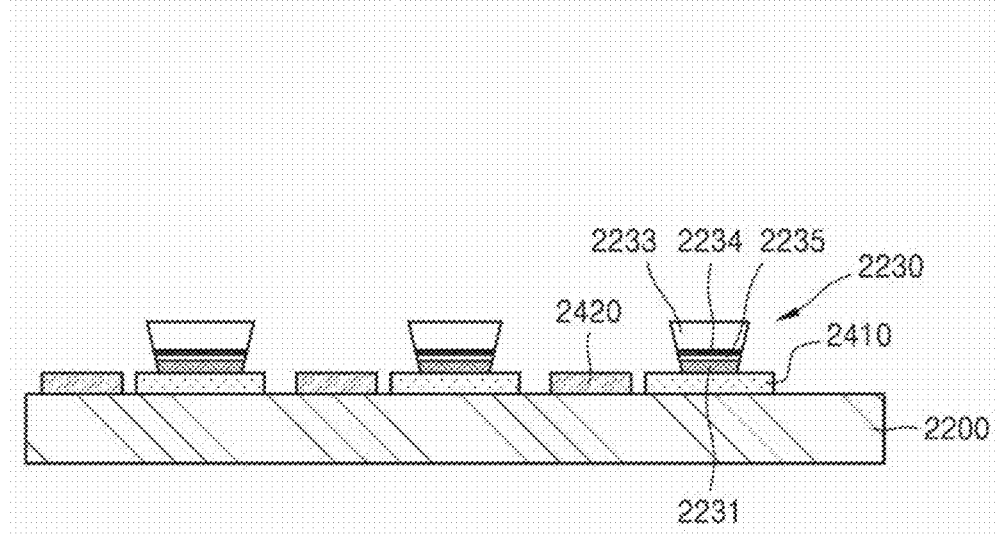

Referring to FIG. 24, the micro light emitting elements 2210, 2220, and 2230 aligned on the transfer substrate 2100 illustrated in FIG. 23 may be transferred to a drive circuit substrate 2200. The drive circuit substrate 2200 may include a first circuit 2410 and a second circuit 2420. When the micro light emitting elements 2210, 2220, and 2230 are transferred onto the drive circuit substrate 2200, a first electrode 2231 may be connected to the first circuit 2410.

Figure 25:
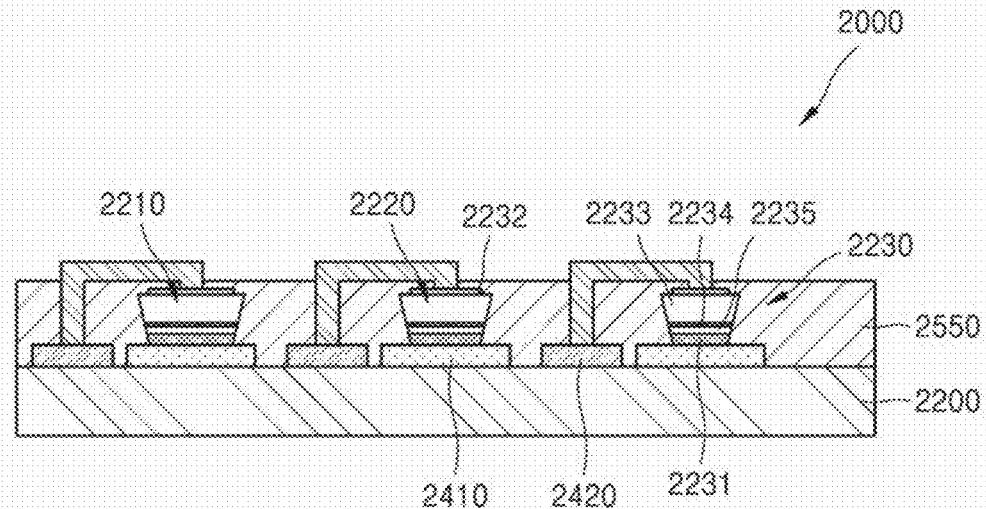

Referring to FIG. 25, an insulating layer 2550 may be provided in the structure illustrated in FIG. 24. In addition, the insulating layer 2550 may be patterned to form a second electrode 2232 on each of the micro light emitting elements 2210, 2220, and 2230 on an opposite side to a side on which the first electrode 2231 is formed. In addition, the second electrode 2232 may be connected to the second circuit 2420.

Figure 26:
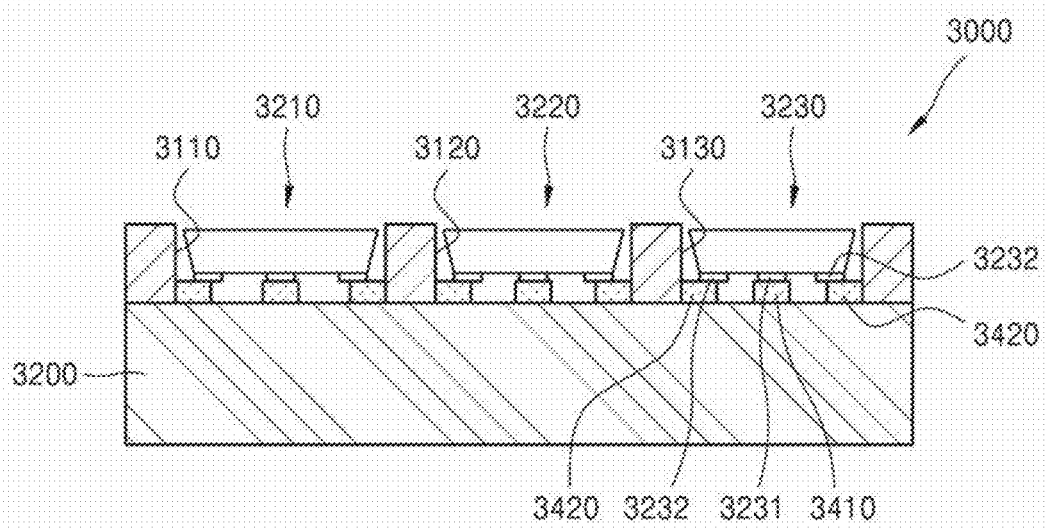
FIG. 26 is a cross-sectional view of a display transferring structure according to an example embodiment.

As another example, referring to FIG. 26, a transfer substrate 3200 to which a plurality of micro light emitting elements 3210, 3220, and 3230 are transferred may be a drive circuit substrate. In this case, one or more electrodes 3410 and 3420 may be provided in each of the grooves 3110, 3120, and 3130 of the transfer substrate 3200, and each of the micro light emitting elements 3210, 3220, and 3230 may include electrodes 3231 and 3232 corresponding thereto and may be arranged thereunder.

As an example, a plurality of electrodes 3410 and 3420 having a certain interval may be arranged inside each of the grooves 3110, 3120, and 3130, and a plurality of electrodes 3231 and 3232 having a certain interval may also be arranged under each of the micro light emitting elements 3210, 3220, and 3230.

Figure 27:
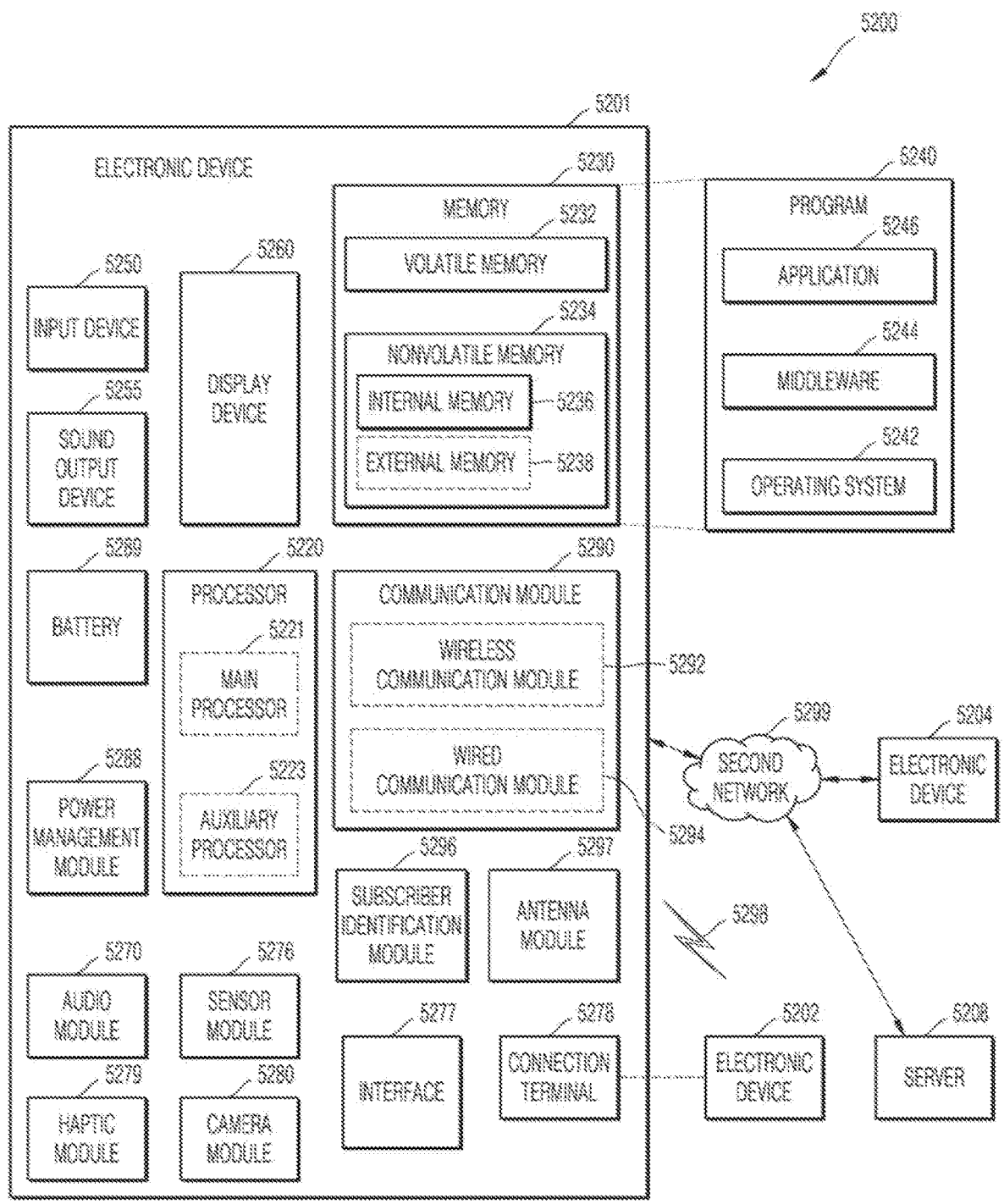
FIG. 27 is a schematic block diagram of an electronic device according to an example embodiment.

FIG. 27 is a block diagram of an electronic device including a display device according to an example embodiment.

Referring to FIG. 27, an electronic device 5201 may be provided in a network environment 5200. In the network environment 5200, the electronic device 5201 may communicate with another electronic device 5202 through a first network 5298 (a short-range wireless communication network or so on), or may communicate with another electronic device 5204 and/or a server 5208 through a second network 5299 (a long-distance wireless communication network or so on). The electronic device 5201 may communicate with the electronic device 5204 through the server 5208. The electronic device 5201 may include a processor 5220, a memory 5230, an input device 5250, a sound output device 5255, a display device 5260, an audio module 5270, a sensor module 5276, an interface 5277, a haptic module 5279, a camera module 5280, a power management module 5288, a battery 5289, a communication module 5290, a subscriber identification module 5296, and/or an antenna module 5297. Part of the configuration elements may be omitted or other configuration elements may be added to the electronic device 5201. Part of the configuration elements may be implemented by one integrated circuit. For example, the sensor module 5276 (fingerprint sensor, iris sensor, illumination sensor, or so on) may be implemented by being embedded in the display device 5260 (display or so on).

The processor 5220 may execute software (program 5240 and son on) to control one or a plurality of other configuration elements (hardware, software configuration elements, and so on) of the electronic device 5201 connected to the processor 5220 and may perform various data processing or operations. The processor 5220 may load commands and/or data received from other configuration elements (the sensor module 5276, the communication module 5290, and so on) into the volatile memory 5232, process the commands and/or the data stored in the volatile memory 5232, and store result data in the nonvolatile memory 5234, as part of data processing or arithmetic. The processor 5220 may include a main processor 5221 (a central processing unit, an application processor, or so on) and an auxiliary processor 5223 (a graphic processing unit, an image signal processor, a sensor hub processor, a communication processor, or so on) which may operate independently or together therewith. The auxiliary processor 5223 may use less power than the main processor 5221 and perform a specialized function.

The auxiliary processor 5223 may control a function and/or a state related to part of the configuration elements (the display device 5260, the sensor module 5276, the communication module 5290, and so on) of the electronic device 5201 on behalf of the main processor 5221 while the main processor 5221 is in an inactive state (sleep state), or with the main processor 5221 while the main processor 5221 is in an active state (application execution state). The auxiliary processor 5223 (an image signal processor, a communication processor, or so on) may be implemented as part of other functionally related configuration elements (the camera module 5280, the communication module 5290, or so on).

The memory 5230 may store various data required by configuration elements (the processor 5220, the sensor module 5276, and so on) of the electronic device 5201. The data may include, for example, software (the program 5240, and so on) and input data and/or output data for commands related thereto. The memory 5230 may include the volatile memory 5232 and/or the nonvolatile memory 5234.

The program 5240 may be stored as software in the memory 5230 and include an operating system 5242, middleware 5244, and/or an application 5246.

The input device 5250 may receive commands and/or data to be used for the configuration elements (the processor 5220 and so on) of the electronic device 5201 from the outside (a user and so on) of the electronic device 5201. The input device 5250 may include a remote controller, a microphone, a mouse, a keyboard, and/or a digital pen (a stylus pen or so on).

The sound output device 5255 may output a sound signal to the outside of the electronic device 5201. The sound output device 5255 may include a speaker and/or a receiver. The speaker may be used for general purposes such as multimedia playback or recording playback, and the receiver may be used to receive incoming calls. The receiver may be coupled as part of a speaker or may be implemented as an independent separate device.

The display device 5260 may visually provide information to the outside of the electronic device 5201. The display device 5260 may include a display, a hologram device, or a projector and a control circuit for controlling a related device. The display device 5260 may include a display transferring structure described with reference to any one or more of FIGS. 23 to 26. The display device 5260 may include a touch circuitry set to sense a touch, and/or a sensor circuit (a pressure sensor and so on) set to measure a strength of force generated by the touch.

The audio module 5270 may convert sound into an electric signal or convert an electric signal into sound. The audio module 5270 may acquire sound through the input device 5250 or may output sound through a speaker and/or a headphone of another electronic device (the electronic device 8102 or so on) directly or wirelessly connected to the sound output device 5255 and/or the electronic device 5201.

The sensor module 5276 may detect an operation state (power, temperature, and so on) of the electronic device 5201 or an external environmental state (a user state and so on), and generate an electrical signal and/or a data value corresponding to the detected state. The sensor module 5276 may include, for example, any one or more of a gesture sensor, a gyro sensor, an atmospheric pressure sensor, a magnetic sensor, an acceleration sensor, a grip sensor, a proximity sensor, a color sensor, an IR (Infrared) sensor, a biometric sensor, a temperature sensor, a humidity sensor, and an illuminance sensor.

The interface 5277 may support one or more designated protocols that may be used for directly or wirelessly connecting the electronic device 5201 to another electronic device (the electronic device 5202 or so on). The interface 5277 may include a high definition multimedia interface (HDMI), a Universal Serial Bus (USB) interface, a secure digital (SD) card interface, and/or an audio interface.

A connection terminal 5278 may include a connector through which the electronic device 5201 may be physically connected to another electronic device (the electronic device 5202 and so on). The connection terminal 5278 may include, for example, any one or more of an HDMI connector, a USB connector, an SD card connector, and an audio connector (a headphone connector or so on).

The haptic module 5279 may convert an electrical signal into a mechanical stimulus (vibration, movement, and so on) that a user may perceive through tactile or kinesthetic sense, or an electrical stimulus. The haptic module 5279 may include a motor, a piezoelectric element, and/or an electrical stimulation device.

The camera module 5280 may capture a still image and/or a video. The camera module 5280 may include a lens assembly including one or more lenses, image sensors, image signal processors, and/or flashes. The lens assembly included in the camera module 5280 may collect light emitted from a subject to be imaged.

The power management module 5288 may manage power supplied to the electronic device 5201. The power management module 5288 may be implemented as part of a power management integrated circuit (PMIC).

The battery 5289 may supply power to configuration elements of the electronic device 5201. The battery 5288 may include a non-rechargeable primary cell, a rechargeable secondary cell, and/or a fuel cell.

The communication module 5290 may support establishment of a direct (wired) communication channel and/or a wireless communication channel between the electronic device 5201 and other electronic devices (the electronic device 5202, the electronic device 5204, the server 5208, and so on), and a communication through the established communication channel. The communication module 5290 may operate independently of the processor 5220 (an application processor or so on) and may include one or more communication processors that support a direct communication and/or a wireless communication. The communication module 5290 may include a wireless communication module 5292 (a cellular communication module, a short-range wireless communication module, a global navigation satellite system (GNSS), and/or a wired communication module 5294 (a Local Area Network (LAN) communication module, a power line communication module, or so on). Among the communication modules, a corresponding communication module may communicate with other electronic devices through a first network 5298 (a short-range communication network such as Bluetooth, WiFi Direct, or infrared data association (IrDA)) or a second network 5299 (a long-distance a telecommunication network such as a cellular network, the Internet, or a computer network (LAN, WAN, or so on)). The various types of communication modules may be integrated into one configuration element (a single chip or so on) or may be implemented by a plurality of separate configuration elements (multiple chips). The wireless communication module 5292 may check and authenticate the electronic device 5201 in a communication network such as the first network 5298 and/or the second network 5299 by using subscriber information (international mobile subscriber identifier (IMSI) and so on) stored in the subscriber identification module 5296.

The antenna module 5297 may transmit a signal and/or power to the outside (other electronic devices and so on) or receive the signal and/or power from the outside. An antenna may include a radiator made of a conductive pattern formed on a substrate (PCB or so on). The antenna module 5297 may include one or a plurality of antennas. When a plurality of antennas are included, an antenna suitable for a communication method used in a communication network such as the first network 5298 and/or the second network 5299 may be selected from among the plurality of antennas by the communication module 5290. A signal and/or power may be transmitted or received between the communication module 5290 and other electronic devices through the selected antenna. In addition to the antenna, other configuration elements (RFIC and so on) may be included in a part of the antenna module 5297.

Part of the configuration elements may be connected to each other through a communication method (bus, general purpose input and output (GPIO), serial peripheral interface (SPI), mobile industry processor interface (MIPI), and so on) between peripheral devices and may interchange signals (commands, data, and so on).

A command or data may be transmitted or received between the electronic device 5201 and the external electronic device 5204 through the server 5208 connected to the second network 5299. The other electronic devices 5202 and 5204 may be the same as or different from the electronic device 5201. All or part of the operations performed by the electronic device 5201 may be performed by one or more of the other electronic devices 5202, 5204, and 5208. For example, when the electronic device 5201 needs to perform a function or service, the electronic device may request one or more other electronic devices to perform the function or part or all of the service instead of perform the function or service by itself. One or more other electronic devices that receive a request may perform an additional function or service related to the request and may transmit a result of the performing to the electronic device 5201. To this end, a cloud computing technology, a distributed computing technology, and/or a client-server computing technology may be used.

Figure 28:
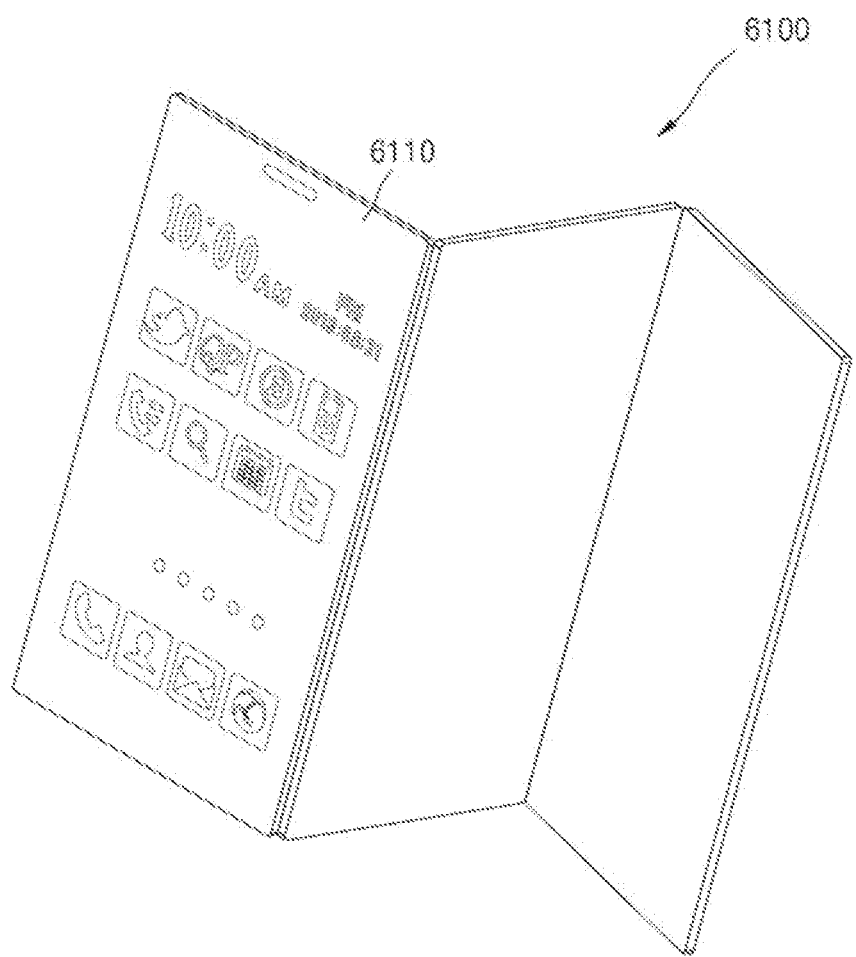
FIG. 28 illustrates an example of applying a display device according to an example embodiment to a mobile device.

FIG. 28 illustrates an example of applying an electronic device according to an example embodiment to a mobile device. The mobile device 6100 may include a display device 6110 according to an example embodiment. The display device 6110 may include the display transferring structure described with reference to any one or more of FIGS. 23 to 26. The display device 6110 may have a foldable structure, and may be applied to, for example, a multi-folder display. Here, the mobile device 6100 is illustrated as a folder type display and may also be applied to a general flat panel display.

Figure 29:
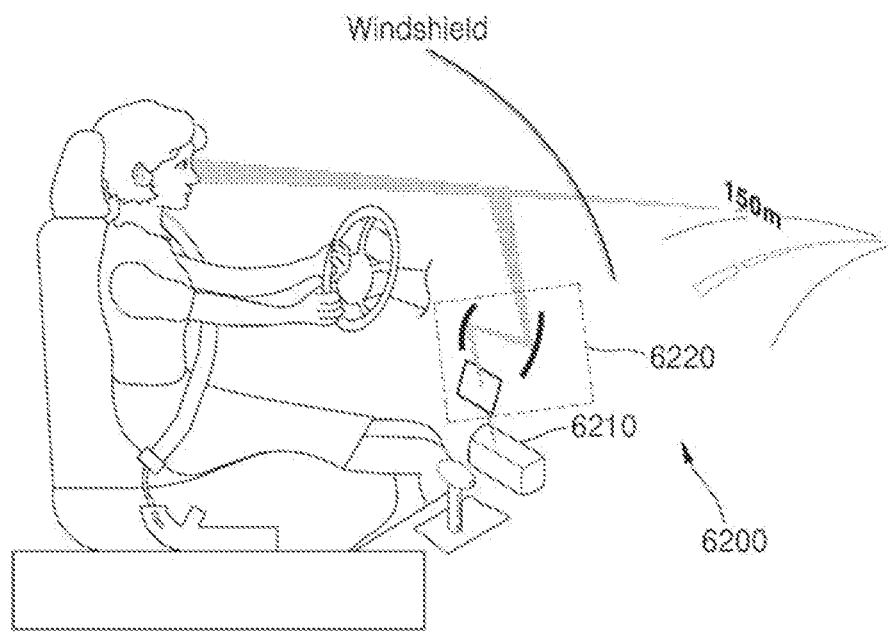
FIG. 29 illustrates an example of applying a display device according to an example embodiment to a vehicle display device.

FIG. 29 illustrates an example of applying a display device according to an example embodiment to a vehicle. The display device may be applied to a head-up display device for an automobile. The head-up display device 6200 may include a display device 6210 provided in a region of an automobile, and at least one light path changing member 6220 for converting a light path so that a driver may view an image generated by the display device 6210.

Figure 30:
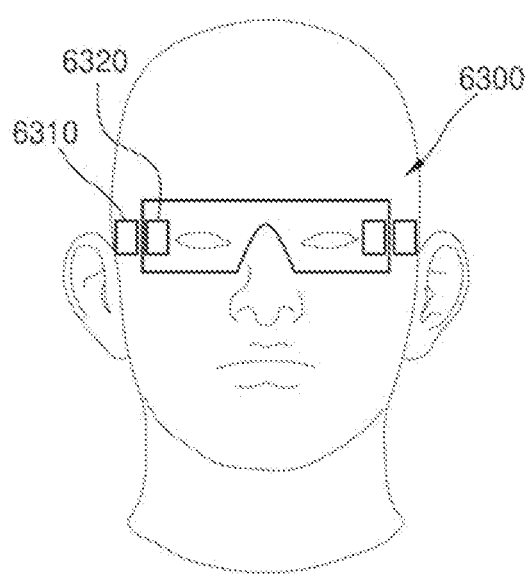
FIG. 30 illustrates an example of applying a display device according to an example embodiment to augmented reality glasses.

FIG. 30 illustrates an example of applying a display device according to an example embodiment to augmented reality glasses or virtual reality glasses. The augmented reality glasses 6300 may include a projection system 6310 for forming an image, and at least one element 6320 for guiding an image from the projection system 6310 to enter eyes of a user. The projection system 6310 may include the display transferring structure described with reference to any one or more of FIGS. 23 to 26.

Figure 31:
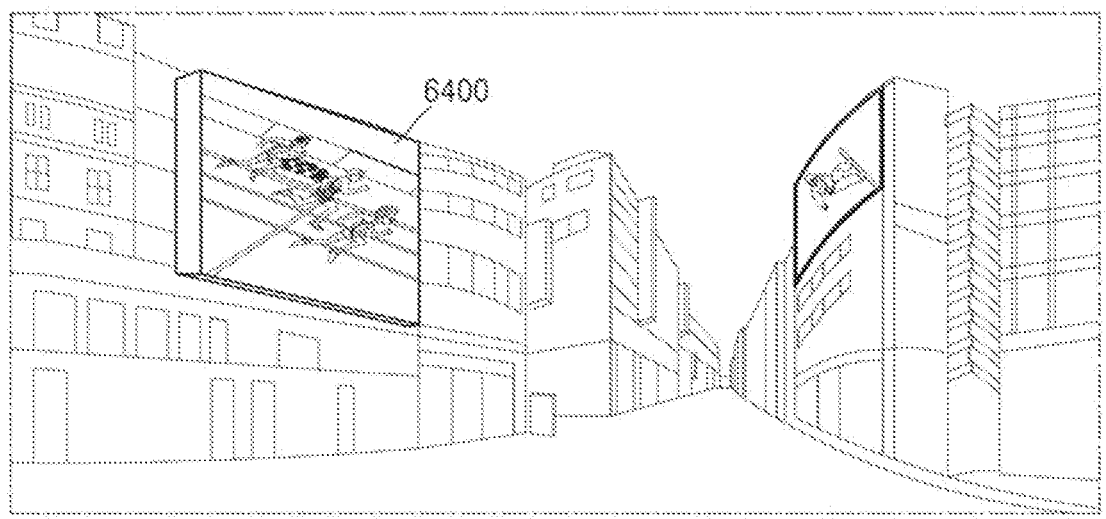
FIG. 31 illustrates an example of applying a display device according to an example embodiment to a signage.

FIG. 31 illustrates an example of applying a display device according to an example embodiment to a large-sized signage. The signage 6400 may be used for outdoor advertisement using a digital information display and may control content of advertisement and so on through a communication network. For example, the signage 6400 may be implemented through the electronic device described with reference to FIG. 27.

Figure 32:
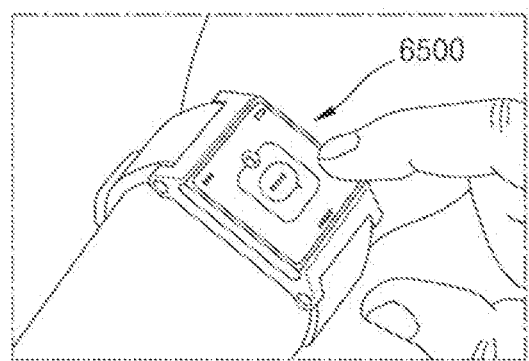
FIG. 32 illustrates an example of applying a display device according to an example embodiment to a wearable display.

FIG. 32 illustrates an example of applying a display device according to an example embodiment to a wearable display. The wearable display 6500 may include the display transferring structure described with reference to any one or more of FIGS. 23 to 26 and may be implemented through the electronic device described with reference to FIG. 27.

The display device according to the example embodiment may be applied to various products such as a rollable TV and a stretchable display.

A method of aligning micro light emitting elements according to an example embodiment may efficiently align the micro light emitting elements to a large area. The micro light emitting elements may be quickly transferred onto a large area, thereby being applied to a large display device, resulting in reduction of a cost of transferring the micro light emitting elements onto the large area, and thus, a cost of the display device may be reduced.

The display transferring structure according to the example embodiment, may be easily employed in a large display device because micro light emitting elements are aligned in a large area.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of transferring a plurality of micro light emitting devices, the method comprising:
supplying the plurality of micro light emitting devices on a transfer substrate including a plurality of grooves having different shapes, the plurality of micro light emitting devices being configured to be inserted exclusively and respectively into the plurality of grooves;
respectively inserting the plurality of micro light emitting devices into the plurality of grooves; and
aligning the plurality of micro light emitting devices,
wherein at least one groove of the plurality of grooves has a cross-sectional shape that is different from a cross-sectional shape of a respective micro light emitting device inserted into the at least one groove, the cross-sectional shape being a shape of a cross section cut in a direction parallel to a plane of the transfer substrate.

2. The method of claim 1, wherein the plurality of grooves comprises a first groove having a first cross-sectional shape, a second groove having a second cross-sectional shape that is different from the first cross-sectional shape, and a third groove having a third cross-sectional shape that is different from the first and second cross-sectional shapes,
wherein the plurality of micro light emitting devices comprises a first micro light emitting device inserted into the first groove and having a fourth cross-sectional shape, a second micro light emitting device inserted into the second groove and having a fifth cross-sectional shape that is different from the fourth shape, and a third micro light emitting device inserted into the third groove and having a sixth cross-sectional shape that is different from the fourth and fifth cross-sectional shapes, and wherein the second cross-sectional shape of the second groove is different from the fifth cross-sectional shape of the second micro light emitting device.

3. The method of claim 2, wherein the second micro light emitting device is configured to be inserted into the second groove in a first posture or in a second posture that is different from the first posture, and wherein the second shape of the second groove prevents the first and third micro light emitting devices from being inserted into the second groove.

4. The method of claim 3, wherein a first region of the second groove into which the second micro light emitting device is inserted in the first posture partially overlaps a second region of the second groove into which the second micro light emitting device is inserted in the second posture.

5. The method of claim 4, wherein the second micro light emitting device has an aspect ratio in which a horizontal length and a vertical length are different from each other.

6. The method of claim 5, wherein the second micro light emitting device faces a first direction when inserted in the first posture into the second groove, and wherein the second micro light emitting device faces a second direction different from the first direction when inserted in the second posture into the second groove.

7. The method of claim 1, wherein each micro light emitting device of the plurality of micro light emitting devices has a shape of a same n-sided polygon and an aspect ratio that is different from aspect ratios of other micro light emitting of the plurality of micro light emitting devices, n being greater than or equal to 3.

8. The method of claim 2, wherein each of the second micro light emitting device and the third micro light emitting device comprises a body portion and a protrusion portion protruding from the body portion, and wherein the second micro light emitting device and the third micro light emitting device are different from each other in at least one of a shape of the body portion, a shape of the protrusion portion, and a position of the protrusion portion.

9. The method of claim 1, wherein at least some of the plurality of micro light emitting devices have an aspect ratio of 1:3 or less.

10. The method of claim 1, wherein the plurality of micro light emitting devices are simultaneously supplied on the transfer substrate.

11. The method of claim 2, wherein the first micro light emitting device, the second micro light emitting device and third micro light emitting device emit colors different from each other.

12. A transfer structure comprising:
a transfer substrate comprising a plurality of first grooves, a plurality of second grooves, and a plurality of third grooves, wherein each first groove of the plurality of first grooves has a first cross-sectional shape, each second groove of the plurality of second grooves has a second cross-sectional shape that is different from the first shape and each third groove of the plurality of third grooves has a third cross-sectional shape that is different from the first and second cross-sectional shapes; and a plurality of first micro light emitting devices inserted into the plurality of first grooves;
a plurality of second micro light emitting devices inserted into the plurality of second grooves; and
a plurality of third micro light emitting devices inserted into the plurality of third grooves, wherein each second micro light emitting device of the plurality of second micro light emitting devices has a cross-sectional shape that is different from a-the second cross-sectional shape of each second groove of the plurality of second grooves, the cross-sectional shape being a shape of a cross section cut in a direction parallel to a plane of the transfer substrate.

13. The transfer structure of claim 12, wherein some second micro light emitting devices of the plurality of second micro light emitting devices inserted into the plurality of second grooves have a first posture, and wherein other second micro light emitting devices of the plurality of second micro light emitting devices have a second posture that is different from the first posture.

14. The transfer structure of claim 13, wherein a first region of a second groove into which a second micro light emitting device of the plurality of second micro light emitting devices is inserted in the first posture partially overlaps a second region of the second groove into which the second micro light emitting device is inserted in the second posture.

15. The transfer structure of claim 14, wherein the second micro light emitting device has an aspect ratio in which a horizontal length of the second micro light emitting device and a vertical length of the second micro light emitting device are different from each other.

16. The transfer structure of claim 15, wherein the second micro light emitting device faces a first direction when inserted in the first posture into the second groove, and wherein the second micro light emitting device faces a second direction different from the first direction when inserted in the second posture into the second groove.

17. The transfer structure of claim 12, wherein each of the plurality of first micro light emitting devices, each of the plurality of second micro light emitting devices, and each of the plurality of third micro light emitting devices has a shape of a same n-sided polygon, n being greater than or equal to 3, wherein each first micro light emitting device of the plurality of first micro light emitting devices has a first aspect ratio, each second micro light emitting device of the plurality of second micro light emitting devices has a second aspect ratio that is different from the first aspect ratio, and each third micro light emitting device of the plurality of third micro light emitting devices has a third aspect ratio that is different from the first and second aspect ratios.

18. The transfer structure of claim 12, wherein each second micro light emitting device of the plurality of second micro light emitting devices and each third micro light emitting device of the plurality of third micro light emitting devices includes a body portion and a protrusion portion protruding from the body portion, and wherein the plurality of second micro light emitting devices are different from the plurality of third micro light emitting devices in at least one of a shape of the body portion, a shape of the protrusion portion, and a position of the protrusion portion.

19. The transfer structure of claim 12, wherein at least some of the plurality of first micro light emitting devices, the plurality of second micro light emitting devices, and the plurality of third micro light emitting devices have an aspect ratio of 1:3 or less.

20. The transfer structure of claim 12, wherein the first micro light emitting device, the second micro light emitting device and third micro light emitting device emit colors different from each other.

\* \* \* \* \*